US010095909B2

(12) United States Patent
Roizin et al.

(10) Patent No.: US 10,095,909 B2
(45) Date of Patent: Oct. 9, 2018

(54) HYBRID MEMS-FLOATING GATE DEVICE

(71) Applicants: Tower Semiconductor Ltd., Migdal Haemek (IL); Newport Fab LLC, Newport Beach, CA (US)

(72) Inventors: Yakov Roizin, Afula (IL); Rassul Karabalin, Huntington Beach, CA (US); David J. Howard, Irvine, CA (US)

(73) Assignees: Tower Semiconductor Ltd., Migdal Haemek (IL); Newport Fab LLC, Newport Beach, CA (US)

( * ) Notice: Subject to any disclaimer, the term of this patent is extended or adjusted under 35 U.S.C. 154(b) by 66 days.

(21) Appl. No.: 15/453,190

(22) Filed: Mar. 8, 2017

(65) Prior Publication Data
US 2018/0260598 A1 Sep. 13, 2018

(51) Int. Cl.
*G06K 9/00* (2006.01)
*H01L 29/788* (2006.01)
*H01L 27/06* (2006.01)
*H01L 29/49* (2006.01)
*G11C 16/04* (2006.01)
(Continued)

(52) U.S. Cl.
CPC .......... *G06K 9/0002* (2013.01); *G06K 9/001* (2013.01); *G11C 16/0408* (2013.01); *G11C 16/10* (2013.01); *G11C 16/26* (2013.01); *H01H 59/0009* (2013.01); *H01L 27/0617* (2013.01);
(Continued)

(58) Field of Classification Search
USPC .......................................................... 382/125
See application file for complete search history.

(56) References Cited

U.S. PATENT DOCUMENTS 5,401,997 A * 3/1995 Lien .................... H01L 27/0251
257/347
6,633,656 B1 10/2003 Picard
(Continued)

OTHER PUBLICATIONS

Han et.al , "Thermal Analysis of Fingerprint Sensor Having a Microheater Array", Nagoya University, 1999 Int. Symposium on Micromechatronics and Human Sciences.
(Continued)

Primary Examiner — Jerome Grant, II
(74) Attorney, Agent, or Firm — Bever, Hoffman & Harms, LLP

(57) ABSTRACT

A hybrid Micro-Electro-Mechanical-System-Floating-Gate (MEMS-FG) device includes an electrically isolated non-volatile memory (floating) structure including a polysilicon gate structure connected by a metal via to a fixed electrode, where the polysilicon gate structure also forms the gate of an NVM cell, and the fixed electrode forms part of a lever-type or membrane-type ohmic MEMS switch. An initial charge is written before each sensing operation onto the floating structure by way of the NVM cell. During each sensing operation, sensor data is effectively written directly onto the NVM cell by way of either maintaining or discharging the initial charge, where discharge of the initial charge occurs when a predetermined event (e.g., contact by a fingerprint ridge) produces an actuating force that biases a movable electrode of the MEMS switch against the fixed electrode. The sensor data is read out from the NVM cell after each sensing operation.

15 Claims, 12 Drawing Sheets

(51) Int. Cl.
*G11C 16/26* (2006.01)
*G11C 16/10* (2006.01)
*H01H 59/00* (2006.01)

(52) U.S. Cl.
CPC ........ *H01L 29/4916* (2013.01); *H01L 29/788* (2013.01)

(56) References Cited

U.S. PATENT DOCUMENTS

| | | |
|---|---|---|
| 6,889,565 B2 | 5/2005 | DeConde et al. |
| 9,053,351 B2 | 6/2015 | Boshra et al. |
| 2004/0179391 A1 | 9/2004 | Bhattacharyya |
| 2013/0250700 A1* | 9/2013 | La Rosa ............... H01L 29/788 365/185.29 |
| 2014/0210866 A1 | 7/2014 | Seo |
| 2015/0076651 A1 | 4/2015 | Noguchi |
| 2018/0114560 A1* | 4/2018 | Kim .................... G11C 11/2275 |

OTHER PUBLICATIONS

N. Sato et.al. "Novel Surface Structure and Its Fabrication Process for MEMS Fingerprint Sensor", IEEE ED 2004.

G.M.Rebeiz et. al. "The Search for a Reliable MEMS Switch?", IEEE Microwave Magazine, 2013.

Jayanti Addepalli and Aseem Vasudev, "Interfacing Atmel Fingerprint Sensor AT77C104B with Backfin Processors", EE-325, Aug. 9, 2007.

* cited by examiner

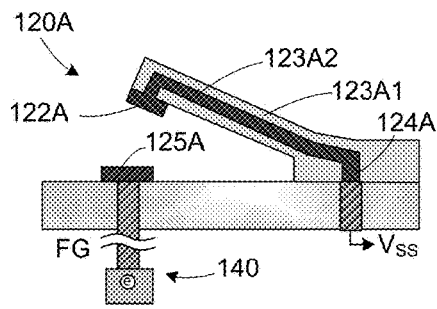
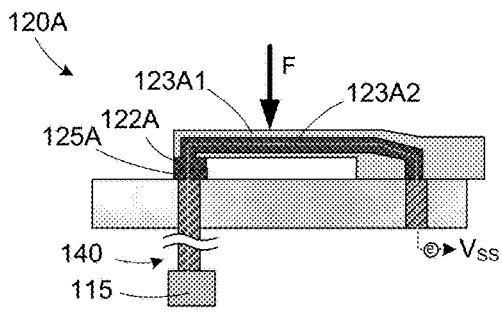
FIG. 3(A)  FIG. 3(B)
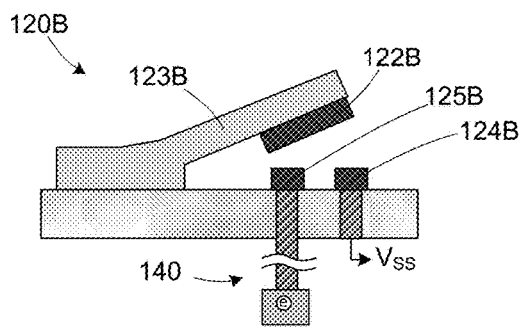
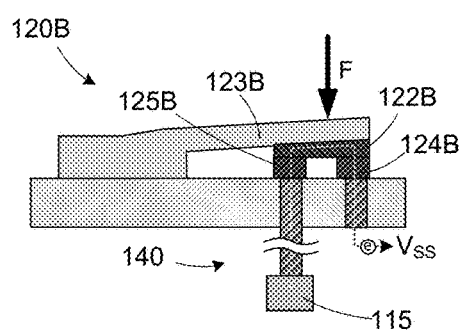
FIG. 4(A)  FIG. 4(B)
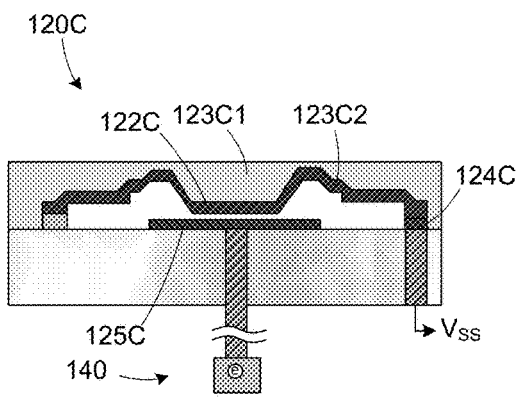
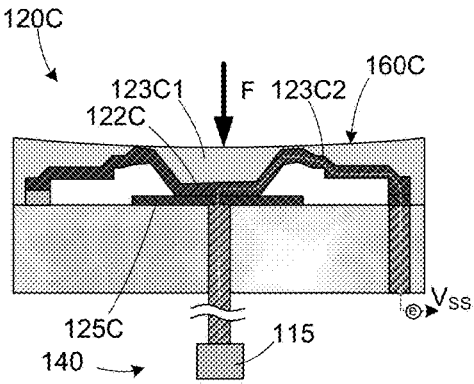
FIG. 5(A)  FIG. 5(B)

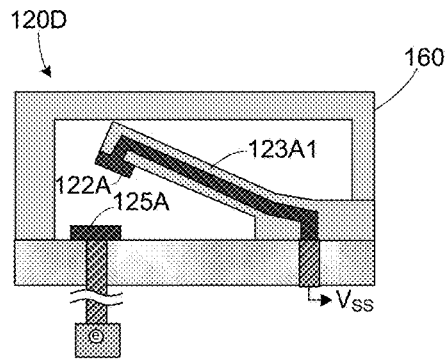
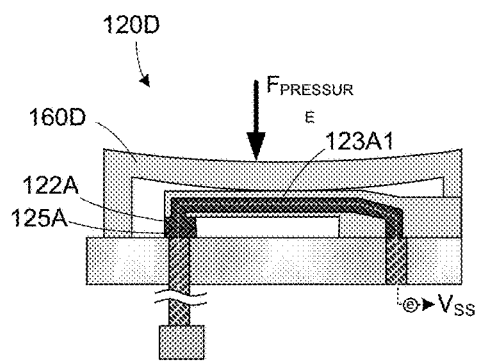
FIG. 6(A)  FIG. 6(B)
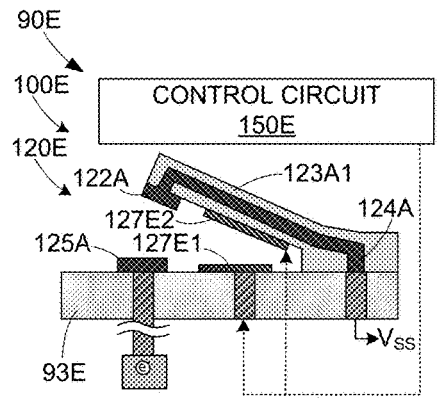
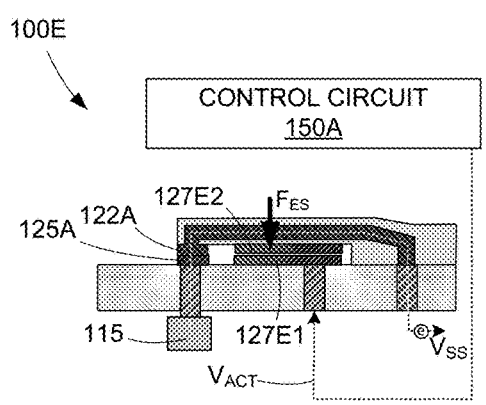
FIG. 7(A)  FIG. 7(B)
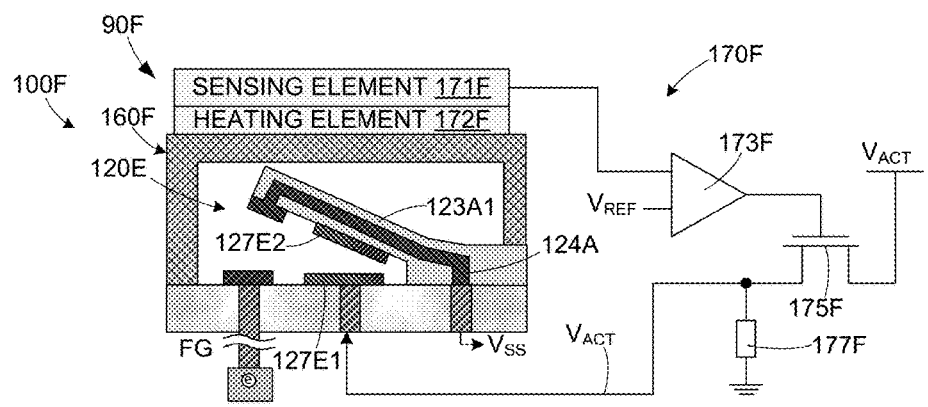
FIG. 8

HYBRID MEMS-FLOATING GATE DEVICE

FIELD OF THE INVENTION

This invention relates to integrated circuits, and more particularly to solid state sensors such as fingerprint sensors.

BACKGROUND OF THE INVENTION

Human fingerprints (FPs) are utilized as primary biometric identifiers because they are detailed, nearly unique, difficult to alter, and durable over the life of an individual. As used herein, the term "fingerprint" refers to the pattern of FP ridges (sometimes referred to as friction ridges) and associated intervening FP valleys (i.e., grooves separating adjacent FP ridges) that are formed by the skin near the tip of a person's finger (typically his/her index finger). The patterns of FP ridges and FP valleys are essentially unique for each individual, and therefore can be reliably utilized to verify the identity of an individual.

Biometric security (or biometric authentication) is used in computer science as a form of identification and access control. Biometrics refers to metrics related to human characteristics. Although fingerprint identification (aka, dactyloscopy) was originally developed to identify criminals and people who are incapacitated or deceased, an electronic form of FP identification is now widely used to provide biometric security on a wide range of computing devices, including advanced mobile phones and Internet-of-Things (IoT) motes. Biometric authentication typically involves securely storing an authorized user's FP data (i.e., data suitably descriptive of the particular FP ridge/valley pattern to distinguish the authorized user's FP from unauthorized FP from other FPs) on a device to be secured, and then controlling subsequent access to the device by requiring a prospective user to verify his/her authority by way of successfully completing an electronic FP identification process. The electronic FP identification process requires the prospective user to touch or otherwise subject his/her finger to an FP sensor connected to the biometrically secured device each time access to the biometrically secured device is attempted. The FP sensor generates "live" FP data (i.e., FP data generated by the FP sensor from the prospective user's finger at the time access is requested) that is then transmitted to the biometrically controlled device's processor for comparison with the stored FP data. When the processor verifies that the live FP data matches the stored FP data, the biometrically secured device is unlocked (i.e., made accessible to the prospective user, who has proven himself/herself to be the authorized user). If the processor fails to match the live FP data with the stored FP data, access to the biometrically secured device is denied.

There are several different types of FP sensors currently utilized to capture live FP data in biometrically secured systems, each type having certain advantages and disadvantages.

Optical FP sensors utilize light sources, optical systems and matrix photo detectors to capture and convert images of a prospective user's fingerprint into live FP data. An advantage provided by optical sensors is that they are highly accurate. A disadvantage of optical sensors is that they are complicated and expensive, and are therefore only used in advanced systems (i.e., optical FP comprise about 1% to 2% of all FP sensors). In addition, optical sensors are unable to distinguish between real and phantom fingerprints.

Capacitive FP sensors measure the impedance between the ridge and valley regions of an applied fingerprint using sensor plates formed on the surface of an integrated circuit (IC) chip. In contrast to optical sensors, capacitive FP sensors are relatively low cost, and therefore most currently-used FP sensors are of the capacitive type. A disadvantage of capacitive sensors is that their accuracy strongly depends on the ambient humidity and the properties of the prospective user's skin (i.e., when a user's skin is relatively dry, capacitive sensors are sometimes unable to accurately distinguish FP ridges from FP valleys). In addition, it is difficult to protect capacitive sensors from static electricity, which is built-up at the capacitor plates due to tribo-electric charging. The static electricity can reach hundreds of volts, and thus thick dielectric layers are used to avoid breakdowns. Even if the static electricity voltages are lower, the charged capacitors can result in vibration-related stray signals, similar to those generated by the presence of a finger, which results in parasitic or false signals. Moreover, like optical sensors, capacitive sensors cannot distinguish between real and phantom fingerprints.

Thermal FP sensors utilize thermal-type pixels configured to detect either contact by an FP ridge or non-contact by an FP valley by way of measuring minute temperature differences, and utilizing the temperature differences to generate a thermal image of an applied fingerprint. An advantage of thermal FP sensors over optical and capacitive sensors is that thermal FP sensors are believed more reliable in distinguishing between real and phantom fingerprints (i.e., because it is difficult to make phantom thermal images that accurately mimic human thermal responses and signatures).

A static-type thermal FP sensor uses an array of thermal sensors disposed below a sensor surface to generate a thermal image of a fingerprint that is pressed and maintained in a fixed (i.e., static) position against the sensor surface. A disadvantage of conventional static-type thermal sensors is that thermal equilibrium is quickly reached at the sensor surface (i.e., the temperature over pixels aligned with either FP ridges or FP valleys stabilizes to a common temperature in less than 100 milliseconds), whereby the thermal image quickly disappears soon after a finger is applied to the sensor surface. The rapid thermal stabilization makes precise timing of the sensing procedure extremely critical, thereby requiring static-type thermal FP sensors to exhibit extremely fast sensor response times and system data acquisition rates, which in turn makes it difficult for static-type thermal FP sensors to obtain accurate live FP data at low cost.

Thermistor-type thermal FP sensors utilize arrays of microthermistors comprising bolometer-type materials (e.g., vanadium oxide ($VO_2$)) fabricated on a substrate. An advantage of thermistor-type thermal FP sensors is that they can register the entire fingerprint area in parallel (i.e., using a static press-and-hold technique instead of a swiping motion) while avoiding the rapid thermal stabilization problem mentioned above. An exemplary thermistor-type thermal FP sensor is taught in U.S. Pat. No. 6,633,656 (Pickard, 2003). As mentioned above, a disadvantage is in that that thermal equilibrium is quickly reached at the sensor surface Another thermal FP sensor approach includes a matrix of micro heating elements formed on 5 μm SOT at a pitch of 80 μm, and operates by heating the elements to tens of degrees above room temperature, where heating rates of the heating elements indicate contact with either an FP ridge or an FP valley. An exemplary micro-heater-type thermal FP sensor is taught in "Thermal Analysis of Fingerprint Sensor Having a Microheater Array", Han et. al., Nagoya University, 1999, Int. Symposium on Micromechatronics and Human Sciences). This does not exclude the mentioned above disadvantage of fast thermal equilibrium.

Swipe-type thermal FP sensors also utilize an array of thermal sensors, but avoid the rapid thermal stabilization problem by way of requiring a prospective user to swipe (i.e., press and slide) his/her finger across the sensor surface, whereby a dynamic thermal image or multiple "snapshot" thermal images of the applied fingerprint may be captured and then combined or otherwise processed to generate live FP data. One conventional swipe-type thermal FP sensor is the FingerChip IC (product number AT77C104B) produced by Atmel Corporation of San Jose, Calif., USA). Although conventional swipe-type thermal FP sensors avoid the precise measurement timing problem associated with static-type thermal FP sensors, the resulting thermal images are often distorted during the swiping process, which requires much more complex FP retrieval algorithm.

Another class of FP sensor utilizes elements produced by Micro-Electro-Mechanical System (MEMS) fabrication techniques to detect the presence/absence of FP ridges/valleys at each pixel location on a sensor surface. One type of MEMS-based FP sensor utilizes an array of pixels, each pixel including a movable electrode disposed in a MEMS cavity, to measure pressure differences applied to the sensor surface by way of measuring changes in capacitance caused by movement of the movable electrode. That is, the movable electrode in each pixel contacted by an FP ridge is actuated such that the pixel generates a signal indicating a capacitive change, and the movable electrode in each pixel aligned with an FP valley is not actuated, and thus the pixel registers zero capacitive change. The sensor has an array of approximately 50,000 pixels and a total sensor area of approximately 11 mm by 13 mm (each pixel having a diameter of about 50 µm), and the capacitance changes generated during an FP identification process are detected by CMOS sensing circuits located under the pixels and converted into digitized signal levels that are then transmitted as live FP data. Such capacitive MEMS-type FP sensors are disclosed, for example, in "Novel Surface Structure and Its Fabrication Process for MEMS Fingerprint Sensor", Norito Sato et. al., IEEE ED 2004. A disadvantage of this type of FP sensor is a complicated algorithm is required to account for vibrations when the ridges are applied to MEMS elements during readout procedures (i.e., during sampling).

Another type of MEMS-based FP sensor uses an array of membrane (or diaphragm) switches, where each membrane switch includes a flexible conductive upper membrane disposed over and spaced apart from a fixed lower electrode, and generates a detection signal when pressed downward by an FP ridge against the lower electrode. During an FP identification process the open/closed state of each membrane switch is measured by measuring the amount of current passed through each switch. One conventional membrane-type FP sensor is taught in U.S. Pat. No. 6,889,565 (Keith et. al, 2005). Advantages of such conventional membrane-type FP sensors includes direct binarization of live FP data (i.e., there is no need for preliminary grey-scale images processing) and immunity to wet/dry fingers and static electricity (i.e., compared with capacitive-type sensors). A disadvantage of this type of FP sensor is the necessity to have a special storage electronics fast enough to register the signal of "closed states" in case of vibrations.

In addition to the specific disadvantages set forth above, a lingering problem with all of the above-mentioned FP sensor types is that they do not facilitate secure transfer of the live FP (biometric) data that must transmitted from the FP sensor to the biometric verifier (i.e., a processor configured to compare the live FP data with the stored FP "template"). That is, because the live FP data is unencrypted, it can be intercepted during transmission from the FP sensor to the processor by unauthorized entities using relatively simple and inexpensive tampering hardware. A conventional secure FP data transmission approach is provided in U.S. Pat. No. 9,053,351 (Boshra et al, "Finger sensing apparatus using image watermarking and associated methods"), which teaches an FP sensor that utilizes watermarking circuitry to encrypt live FP data generated by an array of FP sensor pixels before transmitting the FP data from the FP sensor to the processor. In this case, after transmission, decryption circuitry is utilized to remove the watermark from the encrypted FP data before an FP identification process is performed. Although this approach provides secure transmission from the FP sensor to an external system (processor), a problem with this approach is that the FP data must be first be transmitted in an unencrypted form from the sensor array to the watermarking circuitry, which increases the risk of interception by an unauthorized entity.

What is needed is a solid state sensing device that is capable of generating direct-to-NVM storage of sensor actuation data in a way that avoids the problems associated with the conventional sensor approaches mentioned above. In particular, what is needed is a sensing device that can be fabricated using existing semiconductor fabrication processes, that is able to capture sensed data without the need for precise readout timing circuitry, that exhibits high electrical isolation in an open state and low resistance in a closed state, and is capable of functioning under a variety of humidity conditions. What is also needed is a sensor device having the above characteristics, and also is capable of securely transmitting data to a host system/processor in a way that overcomes the above-mentioned security issues associated with prior art solutions.

SUMMARY OF THE INVENTION

The present invention is primarily directed to a hybrid Micro-Electro-Mechanical-System-Floating-Gate (MEMS-FG) device having an electrically isolated non-volatile memory structure operably formed by fixedly electrically connecting the polycrystalline silicon (polysilicon) gate structure of a Non-Volatile Memory (NVM) cell to a fixed electrode of a normally-open, ohmic-contact-type MEMS switch, and configuring the MEMS switch such that its actuation directly controls (e.g., discharges) the charged state of the polysilicon gate structure. Specifically, the polysilicon gate structure of the NVM cell is fixedly connected (e.g., by way of a metal via or other patterned metal interconnect structure) to the fixed (i.e., non-moving) electrode of the MEMS switch such that these combined structures (i.e., the gate structure, metal interconnect and fixed electrode) form an electrically isolated structure that is capable of storing an electric charge applied to the NVM cell's gate structure. The NVM cell facilitates programming (e.g., by generating an initial charge on the gate structure using Fowler-Nordheim techniques) and readout (i.e., measuring a final charge stored on the gate structure) of the electrically isolated structure using well-established techniques developed for "normal" NVM cells (i.e., NVM cells having polysilicon gate structures that are not connected to metal structures). The MEMS switch includes a movable electrode (e.g., an electrode disposed on a lever arm or membrane) that abut the fixed electrode only when the MEMS switch is actuated (i.e., subjected to an actuating force), and is configured such that, during sensing operation phases of the hybrid MEMS-FG device, contact of the moving electrode with the fixed electrode couples the electrically isolated structure to ground (or another suitable voltage potential), whereby any charge stored on electrically isolated structure is discharged. Because actuation of the MEMS switch is non-volatilely recorded by the electrically isolated structure, the hybrid MEMS-FG device facilitates generating direct-to-NVM storage of MEMS actuation data in a way that avoids many of the problems associated with the conventional approaches mentioned above. That is, the direct-to-NVM storage of MEMS actuation data allows sensed data to be captured without the need for precise readout timing circuitry because actuation of the MEMS switch at any point during the sensing operation period, even for a very brief moment, causes discharge of the electrically isolated structure, which can subsequently be read out at any time after the sensing operation period. In addition, because hybrid MEMS-FG device utilizes a normally-open MEMS switch for detection of actuation events, the electrically isolated structure achieves substantially maximum electrical isolation, which is necessary for the electrically isolated structure to reliably store/maintain an applied charge for a practical amount of time (i.e., at least the amount of time required to perform a sensing operation and subsequent readout operation). In effect, the MEMS switch is a critical element of the hybrid MEMS-FG device because it provides essentially infinite resistance to the electrically isolated structure in its open state (i.e., while the movable electrode is separated from the fixed electrode by an air- or vacuum-filled gap) and very low resistance to the electrically isolated structure in its closed state (i.e., while the movable electrode contacts the fixed electrode), which is cannot be achieved by way of coupling the electrically isolated structure to ground using only a semiconductor switching element such as a pass transistor. Moreover, because data capture is predicated on actuation of the MEMS switch, the hybrid MEMS-FG device is ideal for use in sensor applications, and in particular fingerprint sensor applications, because it is able to implement the high resolution, direct binarization of detected/sensed (e.g., live FP image) data, immunity to wet/dry fingers, and immunity to static electricity benefits associate with MEMS-type fingerprint sensors.

In an exemplary practical embodiment, one or more hybrid MEMS-FG devices of the present invention are fabricated as part of an IC device (e.g., a fingerprint sensor IC) using a fabrication process that integrates both a single-poly CMOS fabrication process, which is utilized to fabricate a circuit layer and a metallization layer including the NVM cell and electrically isolated structure, and a MEMS fabrication process utilized to fabricate a MEMS layer including the MEMS switch. According to an exemplary specific embodiment, each electrically isolated structure is generated by forming the metal interconnect structure using metal via structures extending from each gate structure through the entire metallization layer, and forming the fixed electrode using portions of the last (uppermost) metal layer of the metallization layer that contact upper ends of the meal interconnect structures. A remainder of the MEMS switch is then fabricated in the metallization layer, including a normally-open mechanical ohmic switch mechanism (e.g., a lever-type or membrane-type switch) configured such that a movable electrode contacts a fixed electrode when subjected to an actuating force (i.e., the mechanism normally biases the movable electrode away from the fixed electrode in the absence of the actuating force). According to a specific embodiment, the fixed electrodes include deposited Ruthenium layers, which provide the electrodes with high hardness, low wear and resistance to corrosion. By fabricating the hybrid MEMS-FG devices using the above techniques, the present invention facilitates the production of large area fingerprint (and other) sensors at a relatively low cost. That is, by utilizing standard single-poly fabrication processes, control circuitry can be integrally fabricated on the same substrate with the hybrid MEMS-FG devices, including read/write circuitry configured using known techniques to generate a stored charge on the NVM cell's gate structure during each initialization operating phase, and configured using known techniques to readout a final charge using the NVM cell's gate structure after each imaging/sensing operation phase.

The MEMS switch of the hybrid MEMS-FG device may be implemented using a variety of normally-open configurations and actuating mechanisms in order to facilitate fingerprint imaging operations without diminishing the benefits set forth above. For example, in one embodiment a flexible membrane is operably disposed over the MEMS switch of each hybrid MEMS-FG device, and the MEMS switch is actuated by a pressing force that deforms (bends) the flexible membrane in a manner that pushes the movable electrode against the fixed electrode. A benefit of the direct-pressure-type actuation approach is that this simplifies the electronic circuitry required operate the hybrid MEMS-FG device over scan-type sensors. In another embodiment, the MEMS switch includes one or more electrostatic actuation electrodes attached, for example, to the metallization layer and/or to the MEMS switch's actuation arm, whereby actuation of the MEMS switch is controlled by an actuation signal transmitted onto one of the actuation electrodes, thereby generating an electrostatic force that causes the actuation arm to move the movable electrode against the fixed electrode. A benefit of the electrostatic actuation approach is that each hybrid MEMS-FG device may be further modified to implement a sensing element (e.g., one of a thermal sensor, a capacitive sensor, an ultrasonic sensor and an optical sensor) that is configured to generate the actuating signal, whereby the combined assembly incorporates the additional benefits provided by the selected sensing element type (e.g., the ability to distinguish between real and phantom fingerprints provided by thermal sensors) with the advantages associated with the use of hybrid MEMS-FG devices that are mentioned above.

According to a presently preferred embodiment of the present invention, a differential-NVM-type hybrid MEMS-FG device is provided that includes the hybrid MEMS-FG device arrangement set forth above, and also includes a both a "normal" security (second) NVM cell that is utilized to store a security charge/bit, and an encryption circuit configured to generate an encoded data value based on a logical combination (i.e., XOR) of the final (first) charge stored on the electrically isolated structure (i.e., as measured by way of the (first) gate structure) and the security charge/bit stored on the security NVM cell's gate structure. A read/write circuit is utilized to write the security charge/bit received from an authorized external system (e.g., an FP identification processor) into the normal (second) NVM cell prior to an initial sensing/imaging operation, to initialize the floating structure before each sensing/imaging operation, and to readout an encoded data values after each sensing/imaging operation. By incorporating a security NVM cell and an encryption circuit on each pixel, only encoded data values are transmitted (read out) from the differential-NVM-type hybrid MEMS-FG device to the read/write circuit and/or an external system after each sensing/imaging operation period. By combining the direct-to-NVM capture of pixel data provided by the MEMS switch and electrically isolated structure with the in-place encryption of pixel data provided by the security NVM cell and in-place encryption circuit, the differential-NVM-type hybrid MEMS-FG device provides all of the benefits of the hybrid MEMS-FG device set forth above, and also achieves a level of secure data transfer that is not available in conventional FP sensors.

According to a first alternative embodiment of the present invention, a method for recording detection data directly onto an electrically isolated, non-volatile memory structure (e.g., the electrically isolated structure of any of the hybrid MEMS-FG devices mentioned above) generally involves storing an initial charge on the electrically isolated structure, configuring a MEMS switch to directly discharge the initial charge from the electrically isolated structure if a predetermined event occurs during a sensing operation period, and then determining whether the initial charge was retained or discharged by way of measuring a final charge stored on the electrically isolated structure. One benefit of the method set forth above is that it facilitates direct-to-NVM type data capture by way of recording actuation/non-actuation of the MEMS switch directly onto the electrically isolated structure, even when actuation occurs for only a brief moment during the sensing operation period, thereby facilitating the production of low-cost sensors by way of obviating the need for precise timing circuitry required to capture data using some conventional fingerprint sensors. According to another alternative embodiment of the present invention, the method above is modified to include storing a security bit value on a security NVM cell that is disposed adjacent to the electrically isolated structure (e.g., as part of a single pixel) before the sensing operation period, where subsequent reading of the final charge stored on the electrically isolated, non-volatile memory structure involves generating an encoded data value based on a logical (e.g., XOR) combination of the final charge and the security bit value stored on the security NVM non-volatile memory cell. By storing one or more security bits that are used to encode (encrypt) the "raw" sensor data (i.e., the final charge stored on the electrically isolated structure) before transmission from the device, the present invention further enhances the benefits set forth above by way of providing secure transmission of sensor data.

BRIEF DESCRIPTION OF THE DRAWINGS

These and other features, aspects and advantages of the present invention will become better understood with regard to the following description, appended claims, and accompanying drawings, where:

FIGS. 3(A) and 3(B) are diagrams showing a first lever-type MEMS switch utilized by the hybrid MEMS-FG device of FIG. 1 according to a specific embodiment of the present invention;

FIGS. 4(A) and 4(B) are diagrams showing a second lever-type MEMS switch utilized by the hybrid MEMS-FG device of FIG. 1 according to another specific embodiment of the present invention;

FIGS. 5(A) and 5(B) are diagrams showing a membrane-type MEMS switch utilized by the hybrid MEMS-FG device of FIG. 1 according to another specific embodiment of the present invention;

FIGS. 6(A) and 6(B) are cross-sectional side views showing the MEMS switch of FIG. 3(A) in combination with a flexible cover according to another specific embodiment of the present invention;

FIGS. 7(A) and 7(B) are cross-sectional side views showing a MEMS switch actuated by electrostatic force according to another specific embodiment of the present invention;

FIG. 8 is a diagram depicting a hybrid MEMS-FG device including a sensor and a MEMS switch actuated by electrostatic force according to yet another specific embodiment of the present invention;

DETAILED DESCRIPTION OF THE DRAWINGS

The present invention relates to an improvement in sensing elements utilized in fingerprint sensors and other sensor applications. The following description is presented to enable one of ordinary skill in the art to make and use the invention as provided in the context of a particular application and its requirements. As used herein, directional terms such as "upper" are intended to provide relative positions for purposes of description, and are not intended to designate an absolute frame of reference. The terms "coupled" and "connected", which are utilized herein, are defined as follows. The term "connected" is used to describe a direct connection between two circuit elements, for example, by way of a metal line formed in accordance with normal integrated circuit fabrication techniques. In contrast, the term "coupled" is used to describe either a direct connection or an indirect connection between two circuit elements. For example, two coupled elements may be directly connected by way of a metal line, or indirectly connected by way of an intervening circuit element (e.g., a capacitor, resistor, inductor, or by way of the source/drain terminals of a transistor). Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
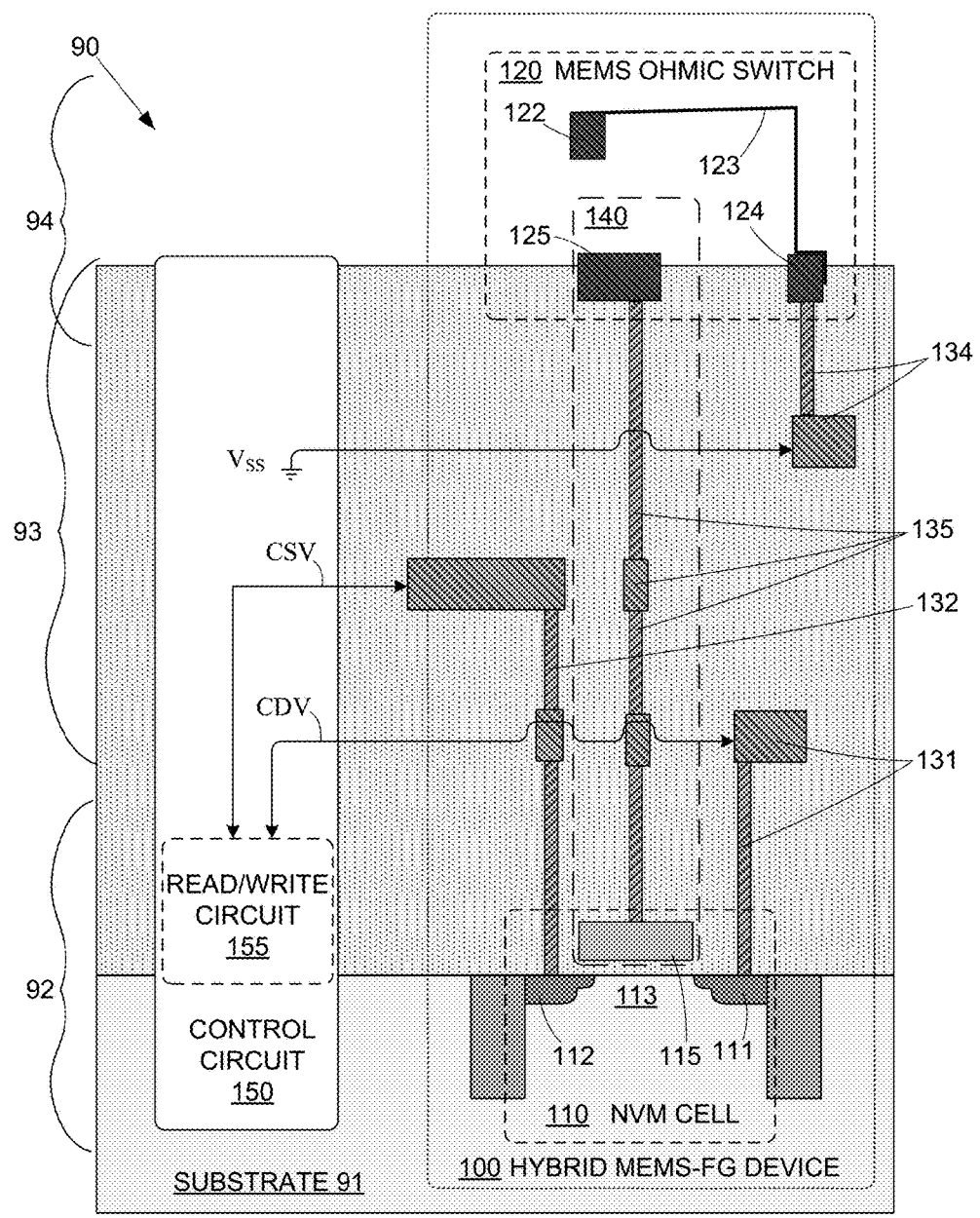
FIG. 1 is a simplified cross-sectional side view showing an IC including a hybrid MEMS-FG device according to a generalized embodiment of the present invention.

FIG. 1 shows an integrated circuit (IC) device 90 (e.g., a fingerprint sensor) generally including a circuit layer 92 formed in and on a semiconductor (e.g., monocrystalline silicon) substrate 91, a metallization layer 93 formed over circuit layer 92, and a Micro-Electro-Mechanical-System (MEMS) layer 94 formed on metallization layer 92. Circuit layer 92 and metallization layer 93 are fabricated using well-known single polycrystalline silicon (referred to herein as "polysilicon" or "poly") complimentary-metal-oxide-silicon (CMOS) fabrication processing techniques, where circuit layer 92 includes both diffusion regions formed in substrate 91, and polysilicon structures (e.g., gate 115) formed by patterned portions of a single polycrystalline silicon layer disposed between an upper surface of substrate 91 and metallization layer 93. A pre-metal dielectric layer is typically formed over substrate 91 and the polysilicon structures, and pre-metal contacts (via structures) are formed through the pre-metal dielectric material to provide electrical contact to the diffusions and polysilicon structures. Metallization layer 93 is then formed over the pre-metal dielectric the FG structure 115 using known techniques, and includes multiple sequentially patterned metal layers (e.g., Aluminum or Copper layers, which are typically referred to in the art as "Metal-1", "Metal-2", etc.), respectively separated by an inter-metal dielectric material (e.g., SiO2), where signals are passed between metal lines in adjacent metal layers by way of metal via structures. MEMS layer 94 is then formed on metallization layer 93 using known MEMS fabrication techniques.

IC 90 includes a hybrid Micro-Electro-Mechanical-System-Floating-Gate (MEMS-FG) device 100 including a non-volatile memory (NVM) cell 110 formed in circuit layer 92, a normally-open, ohmic-contact-type MEMS switch 120 formed in MEMS layer 94, and an electrically isolated non-volatile (floating) structure 140 formed by integrally connected structures extending between circuit layer 92 and MEMS layer 94.

NVM cell 110 includes a drain region 111 and a source region 112 formed by suitable dopants diffused into semiconductor substrate 91, with an appropriately doped or undoped channel region 113 provided therebetween. A polysilicon gate structure 115, which is effectively shared by NVM cell 110 and floating structure 140 as set forth below, is located between substrate 91 and metallization layer 93 and operably disposed over channel region 113 such that current flow between drain region 111 and source region 112 is controlled by a charge stored or otherwise applied to gate structure 115.

MEMS switch 120 includes a movable electrode 122 disposed on an actuation arm (member) 123 that is electrically connected to a source electrode 124 disposed on metallization layer 93. A fixed electrode 125, which is effectively shared by MEMS switch 120 and floating structure 140 as set forth below, is disposed below movable electrode 122. In one embodiment, fixed electrode 125 is formed by a patterned portion of an uppermost metal layer of metallization layer 93. In another embodiment, at least one of fixed electrode 125 and movable electrode 122 comprise Ruthenium layers, which is advantageous because Ruthenium has an extremely high hardness, low wear and resistance to corrosion, mainly due to natural Ruthenium oxide that covers the surface of electrodes and has a conductivity at the level of the non-oxidized Ruthenium. MEMS switch 120 configured in a normally-open configuration such that movable electrode 122 is biased away from fixed electrode 125 in the absence of an actuating force F (e.g., as shown and described below with reference to FIG. 2(D)), and such that movable electrode 122 abuts fixed electrode 125 when MEMS switch 120 is subjected to actuating force F (e.g., as shown and described below with reference to FIG. 2(E)). Actuation arm 123 is formed using known MEMS fabrication techniques to provide both a spring-like resilience that causes movable electrode 122 to move away from fixed electrode 125 upon termination of the actuating force, and in the depicted embodiment consists of or includes an electrically conductive material configured to form an electrically conductive path along its length between movable electrode 122 and source electrode 124, whereby a potential applied to source electrode 124 is passed to fixed electrode 125 along actuation arm 123 when moveable electrode 122 is in contact with fixed electrode 125.

Floating 140 is a contiguous assembly including polysilicon gate structure 115, fixed electrode 125, and also includes a metal structure 135 made up of one or more contiguous portions of metallization layer 93 (e.g., metal vias and sections and patterned sections of the multiple metal layers) that extend entirely through metallization layer 93, and is fixedly electrically connected at its lower end to polysilicon gate structure 115 and at its upper end to fixed electrode 125. Similar to the floating gate of a "normal" NVM cell, the contiguous assembly made up of gate structure 115, fixed electrode 125 and metal structure 135 is entirely surrounded by electrically insulating material such that an electric charge applied to floating 140 is retained (stored) in a manner similar to that of an NVM cell's floating gate. As mentioned above, floating 140 shares polysilicon gate structure 115 with NVM cell 110, and shares fixed electrode 125 with MEMS switch 120. In particular, polysilicon gate structure 115 is configured such that a charge can be applied to (i.e., written onto) floating 140 by way of operating NVM cell 110 using a known NVM programming technique (e.g., Fowler-Nordheim tunneling), and a charge stored on floating 140 can be determined by way of operating NVM cell 110 using a known NVM readout technique. In addition, fixed electrode 125 is coupled by way of metal structure 125 such that a charge stored on floating 140 can be discharged by way of contact between fixed electrode 125 and movable electrode 122 in the manner described below.

Referring to the lower left portion of FIG. 1, IC 90 also includes a control circuit 150 that is depicted in block diagram form for brevity. Control circuit 150 includes a read/write circuit 155 that is configured to transmit signals to and from hybrid MEMS-FG device 100 during operation by way of additional metal structures formed in metallization layer 93, which are depicted in FIG. 1 using arbitrary exemplary combinations of metal vias and patterned metal layer structures. For example, read/write circuit 155 is configured using known techniques to generate stored charges on and read information from floating gate structure 115 by way of a control signal CDV transmitted to drain region 111 by way of metal structures 131, and by way of a control signal CSV transmitted to source region 112 by way of metal structures 132. In the exemplary embodiment, metal structure 134 is utilized to couple source electrode 124 of MEMS switch 120 to a ground potential ($V_{SS}$), whereby movable electrode is coupled to the ground potential by way of actuation arm 123, source electrode 124 and metal structure 134.

FIGS. 2(A) to 2(F) depicts hybrid MEMS-FG device 100 during various operating phases that depict an exemplary method for recording data directly onto a non-volatile memory structure (e.g., floating structure 140) during a sensing operation. Although the method is depicted with specific reference to hybrid MEMS-FG device 100, the method is also applicable to any of the various alternative embodiments described below, and to other devices that combine the operation of a MEMS-type switch and an electrically isolated, non-volatile memory structure in the manner described herein.

Figure 2A:
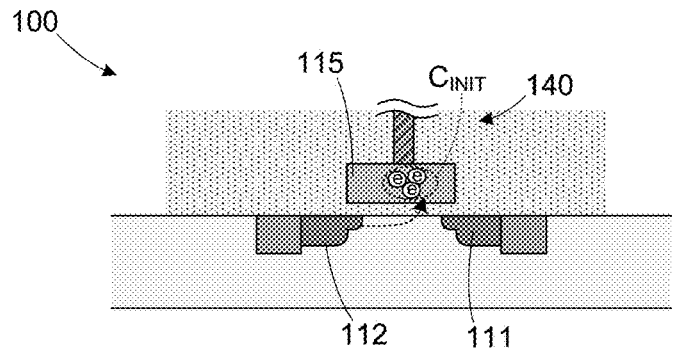
FIGS. 2(A), 2(B), 2(C), 2(D), 2(E) and 2(F) are simplified diagrams showing a portion of the hybrid MEMS-FG device of FIG. 1 during exemplary initialization, sensing and readout operations.

Referring to FIG. 2(A), the method includes storing (writing) an initial charge $C_{INIT}$ on floating structure 140 during an initialization phase that is performed before beginning a sensing operation. In one embodiment, storing the initial charge is performed by way of operating NVM cell 110 using known NVM operating techniques such that initial charge $C_{INIT}$ is transferred onto polysilicon gate structure 115. In one specific embodiment, NVM cell 110 is formed as an asymmetric cell, a voltage applied to drain 111 is coupled to gate structure 115 and channel 113 is opened, whereby electrons are injected into gate structure 115 close to 111. In another specific embodiment, polysilicon gate structure 115 is operably coupled to control and injection capacitors (not shown), and voltages are applied to these capacitors such that electrons are injected from substrate 91 into polysilicon gate structure 115. The charged state of initial charge $C_{INIT}$ on polysilicon gate structure 115 at the end of the initialization period is indicated by the electrons (e) disposed inside the dashed-line bubble. Note that initial charge $C_{INIT}$ is of an amount that produces a measureable change in the operation of NVM cell 110 (e.g., a measurably lower channel current is generated between drain region 111 and source region 112 when initial charge $C_{INIT}$ is stored on polysilicon gate structure 115 than when polysilicon gate structure 115 is discharged). Although polysilicon gate structure 115 differs from conventional floating gate structures found in "normal" NVM cells, polysilicon gate structure 115 (and, hence, floating structure 140) is able to retain (store) at least a portion of initial charge $C_{INIT}$ for at least a practical amount of time (i.e., at least the amount of time required to perform the sensing operation and subsequent readout operation depicted in FIGS. 2(C) to 2(F)) of time by way of the electrically isolated state of the floating structure assembly (i.e., polysilicon gate structure 115, metal structure 135 and fixed electrode 125). That is, if MEMS switch 120 were replaced with an ultra-low leakage MOS transistor connected to a polysilicon gate and utilized to discharge the gate in response to an actuation event, the polysilicon gate would only be capable of storing charge for less than 0.1 sec, which is not long enough for fingerprint imaging (sensing) and other practical sensor applications. By way of comparison, utilizing MEMS switch 120 to discharge floating structure 140 allows floating structure 140 to retain a significant amount of an initial charge for up to several minutes.

Figure 2B:
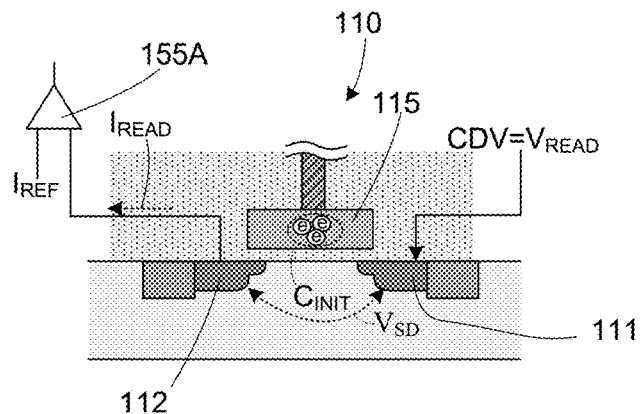

FIG. 2(B) depicts an optional step of verifying that initial charge $C_{INIT}$ was properly written onto floating structure 140 before beginning a sensing operation. In one embodiment, this optional step is performed using known NVM operating techniques, e.g., by way of comparing a read current $I_{READ}$ passing through polysilicon gate structure 115 with a predetermined reference current $I_{REF}$ using a sense amplifier 155A, which may be part of read/write circuit 155 (shown in FIG. 1). Specifically, control signal CDV is asserted using a suitable read voltage $V_{READ}$, and the proper or improper writing of initial charge $C_{INIT}$ onto gate structure 115 is determined by way of determining whether read current $I_{READ}$ generated in source region 112 is greater than or less than reference current $I_{REF}$. In other embodiments, the actual amount of charge stored on floating structure 140 may be measured. In yet other embodiments, the optional step depicted in FIG. 2(B) may be omitted entirely.

Figure 2C:
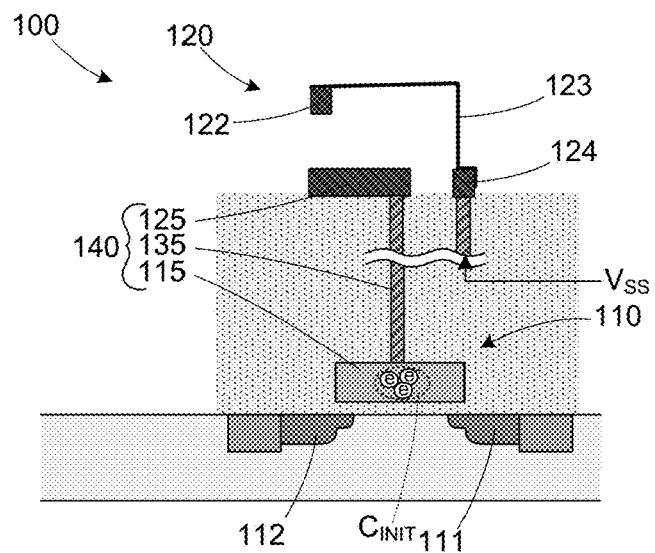
Figure 2D:
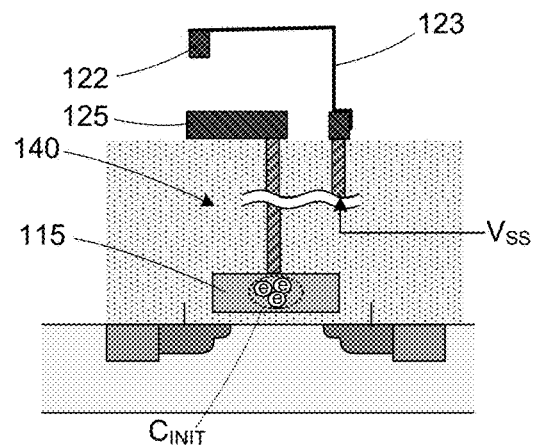
Figure 2E:
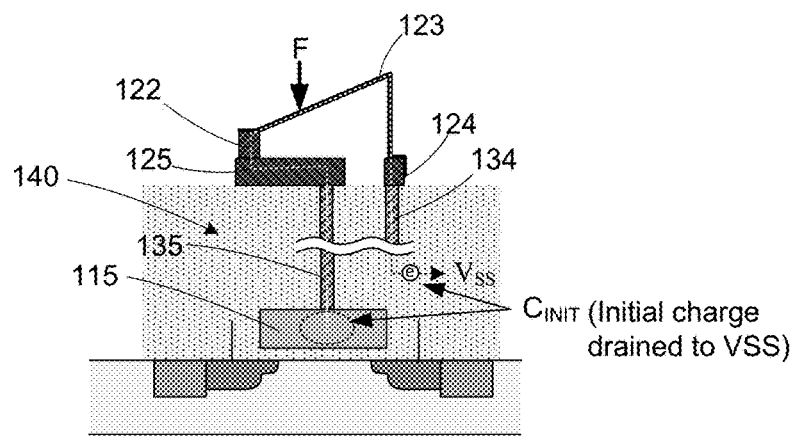

FIGS. 2(C) to 2(E) depict the operation of hybrid MEMS-FG devices 100 during a subsequent sensing operation period. Referring to FIG. 2(C), at the beginning of the sensing operation period, both drain region 111 and source region 112 are disconnected (i.e., not selected), and MEMS switch 120 is configured to discharge initial charge $C_{INIT}$ from floating structure 140 by way of coupling movable electrode 122 to ground ($V_{SS}$) by way of actuation arm 123 and source electrode 124. Note that, in cases where source electrode 124 is permanently connected to ground during all operating phases, the above-mentioned configuration state of MEMS switch 120 is maintained during all operating phases, and a specific coupling step (e.g., actuation of a pass transistor) is not required to couple movable electrode 122 to ground. Note also that, at the beginning of the sensing operation period, a voltage potential at fixed electrode 125 is determined by initial charge $C_{INIT}$ stored on floating structure 140. With initial charge $C_{INIT}$ stored on floating structure 140 and MEMS switch 120 configured in this manner, sensed data is effectively directly written onto floating structure 140 by way of subsequent operations (i.e., either actuation or non-actuation) of MEMS switch 120 during the sensing operation period. Specifically, as indicated in FIG. 2(D), in the absence of an actuating event (i.e., while no suitable actuating force is applied to actuation arm 123 or other mechanical mechanism, whereby movable electrode 122 remains physically separated from fixed electrode 125 during a given sensing operation period), sensor data in the form of a logic value (e.g., binary "0") indicating a non-sensing event is effectively "directly written" onto floating structure 140 by way of the retention of initial charge $C_{INIT}$ on gate 115). Conversely, as indicated in FIG. 2(E), if an actuating event occurs at any point during the sensing operation (e.g., an actuating force F is applied to actuating arm 123 that pushes movable electrode 122 into contact with fixed electrode 125), this actuating event is directly recorded by way of discharging initial charge $C_{INIT}$ from floating structure 140 (i.e., from gate 115 along metal structure 135 and fixed electrode 125 to movable electrode 122, from movable electrode 122 along actuation arm 123 to source electrode 124, and from source electrode 124 to $V_{SS}$ by way of metal structure 134).

Figure 2F:
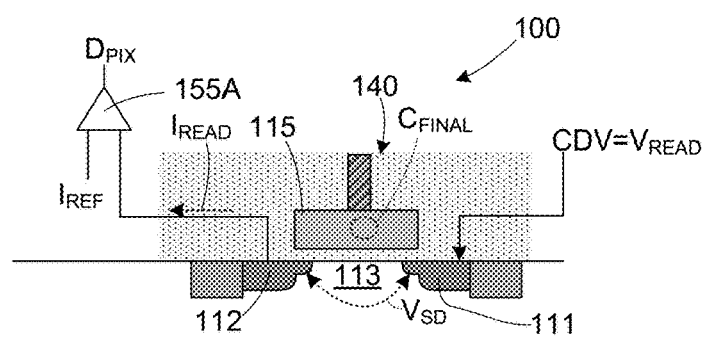

Referring to FIG. 2(F), after an end of the sensing operation period, a final sensor data value $D_{PIX}$ stored on MEMS-FG device 100 is determined by way of measuring (reading) a final charge $C_{FINAL}$ stored on floating structure 140. As set forth above, final charge $C_{FINAL}$ is substantially equal to the initial charge in cases of non-actuation of the MEMS switch during the sensing operation period, and has a substantially lower charge value when the actuation event depicted in FIG. 2(E) occurs at any point during the sensing operation period). In one embodiment, final charge $C_{FINAL}$ is measured by way of operating NVM cell 110 using the well-known NVM operating techniques described above with reference to FIG. 2(B), with the resulting source-current $I_{READ}$ compared with reference current $I_{REF}$ by sense amplifier 155A in order to generate final sensor data value $D_{PIX}$ (e.g., final sensor data value $D_{PIX}$ has a low current (binary "1") value when the source current $I_{READ}$ is lower than reference current $I_{REF}$, and final sensor data value $D_{PIX}$ has a high current (binary "0") value when source current $I_{READ}$ is greater than reference current $I_{REF}$.

As set forth in the example shown in FIGS. 2(A) to 2(F), hybrid MEMS-FG device 100 exhibits unique operating characteristics by way of combining the program/readout convenience of NVM cell operations with the virtually infinite resistance provided by a MEMS switch. That is, NVM cell 110 facilitates programming (e.g., by way of generating initial charge $C_{INIT}$ on the gate 115 using Fowler-Nordheim techniques) and readout (i.e., measuring final charge $C_{FINAL}$ stored on the gate 115) of floating structure 140 using well-established techniques developed for "normal" NVM cells (i.e., NVM cells having polycrystalline silicon gate structures that are not connected to metal structures). In addition, when MEMS switch 120 is in its off (open) state (e.g., as depicted in FIG. 2(D)), movable electrode 122 and fixed electrode 125 are separated by a vacuum or air gap, thus providing virtually infinite resistance with vanishing leakage, which is critical in maintaining initial charge $C_{INIT}$ on floating structure 140 during the sensing operation period, which cannot be achieved by way of coupling the electrically isolated structure 140 to ground using only a semiconductor switching element such as a pass transistor. Conversely, when MEMS switch 120 is in its on (closed) state (i.e., while movable electrode 122 contacts fixed electrode 125, as depicted in FIG. 2(E)), the resistance across MEMS switch 120 becomes a virtual short (i.e., less than 1 Ohm), thereby facilitating essentially complete discharge of initial charge $C_{INIT}$ from floating structure 140 to ground. By directly writing sensor data onto floating structure 140 based on the actuation/non-actuation of MEMS switch 120, and by reading the sensor data using conventional NVM techniques by way of NVM cell 110, hybrid MEMS-FG device 100 provides an ideal element for many types of sensors, particularly fingerprint sensor applications (as described in additional detail below).

FIGS. 3(A) to 5(B) depict exemplary alternative normally-open MEMS switch configurations that may be utilized to implement alternative hybrid MEMS-FG devices of the present invention. Note that the depicted switch configurations are intended to establish that many different MEMS configurations may be utilized, and are not intended to limit the appended claims unless specifically referenced.

FIGS. 3(A) and 3(B) depict a partial alternative hybrid MEMS-FG device having a first lever-type MEMS switch 120A including an actuating arm 123A1 comprising a suitable resilient material and including a metal conductor 123A2 that is connected between source electrode 124A and moveable electrode 122A. As indicated in FIG. 3(A), in a resting state actuating arm 123A1 biases movable electrode 122A away from fixed electrode 125A, whereby a charge stored on floating structure 140 is retained. As indicated in FIG. 3(B), when a biasing force F is applied to actuating arm 123A1, actuating arm 123A1 is deflected such that movable contact 122A abuts fixed contact 125A, thereby forming a conductive path between polysilicon gate structure 115 and $V_{SS}$ by way of metal conductor 123A2, whereby floating structure 140 is discharged.

FIGS. 4(A) and 4(B) depict another partial alternative hybrid MEMS-FG device having a second lever-type MEMS switch 120B including an actuating arm 123B formed by a suitable resilient material having an elongated moveable electrode 122B formed at its free end. In this case source electrode 124B is located adjacent to fixed electrode 125B. As indicated in FIG. 4(A), in a resting state actuating arm 123B biases movable electrode 122B away from source electrode 124B and fixed electrode 125B, whereby a charge stored on floating structure 140 is retained. As indicated in FIG. 4(B), when a biasing force F is applied to actuating arm 123B, actuating arm 123B is deflected such that movable contact 122A abuts both source contact 124B and fixed contact 125A, thereby forming a conductive path between polysilicon gate structure 115 and $V_{SS}$ by way of elongated movable contact 122B, whereby floating structure 140 is discharged.

FIGS. 5(A) and 5(B) depict another partial alternative hybrid MEMS-FG device having a membrane-type MEMS switch 120C including a disc-shaped actuating member 123C1 comprising a suitable resilient material and including a moveable electrode 122C disposed in a central region of actuating member 123C1, and a metal conductor 123C2 that is operably secured to an underside surface of actuating member 123C1 and electrically connected between source electrode 124C and movable electrode 122C. As indicated in FIG. 5(A), in a resting state actuating member 123C1 biases movable electrode 122C away from fixed electrode 125C, whereby a charge stored on floating structure 140 is retained. As indicated in FIG. 5(B), when a biasing force F is applied to actuating member 123C1, actuating member 123C1 collapses (deflects downward) such that movable contact 122C abuts fixed contact 125C, thereby forming a conductive path between polysilicon gate structure 115 and $V_{SS}$ by way of metal conductor 123C2, whereby floating structure 140 is discharged.

FIGS. 6(A) and 6(B) depict another partial alternative hybrid MEMS-FG device having an MEMS switch 120D formed in accordance with another exemplary embodiment. In this case MEMS switch 120D includes the lever-type structure of MEMS switch 120A (described above with reference to FIG. 2(A)), and also includes a flexible membrane 160D that is configured to facilitate actuation of MEMS switch 120D by way of pressure or a pressing force. In a specific embodiment, flexible membrane 160D comprises a suitable plastic or silicone-based polymer material) that is operably disposed over the actuation arm 123A1 in a manner that protects actuation arm 123A1 and fixed electrode 125A from external environmental contamination. Referring to FIG. 6(A), flexible membrane 160D is also configured to move upward (i.e., away from actuation arm 123A1) such that actuation arm 123A1 is able to position movable contact 122A away from fixed contact 125A in the absence of an external actuating force. Referring to FIG. 6(B), a pressing (actuating) force $F_{PRESSURE}$ applied onto flexible membrane 160D deforms (bends) flexible membrane 160D downward against actuation arm 123A1, thereby pushing movable electrode 122A against fixed electrode 125A. Note that other normally-open MEMS switch types may be formed with similar flexible membranes. For example, referring again to FIG. 5(B), disc-shaped actuating member 123C1 may also serve as a flexible membrane 160C that is operably disposed over MEMS switch 120C such that movable electrode 122C contacts fixed electrode 125C in response to deformation of flexible membrane 160C by a pressing-type actuating force applied as indicated by the arrow in FIG. 5(B). As set forth in the fingerprint (FP) sensor embodiments described below, a benefit of the direct-pressure-type actuation approach described above with reference to FIGS. 6(A) and 6(B) is that this actuating approach facilitates static-touch FP sensor operations, which are preferable to scan-type FP sensor operations for reasons set forth above.

Although direct pressure actuation (described above with reference to FIGS. 6(A) and 6(B)) is presently preferred, hybrid MEMS-FG devices of the present invention may also be constructed using MEMS switches that are actuated by other actuating mechanisms that facilitate incorporating these alternative hybrid MEMS-FG devices onto various conventional sensor platforms. For example, FIGS. 7(A) and 7(B) depict an IC 90E including a hybrid MEMS-FG device 100E including a MEMS switch 120E comprising the lever-type structure of MEMS switch 120A (described above with reference to FIG. 2(A)), and also including electrostatic actuation electrodes 127E1 and 127E2. In the disclosed embodiment, electrode 127E1 is attached to metallization layer 93E below actuation arm 123A1, and electrode 127E2 is attached to actuation arm 123A1 above electrode 127E1. As indicated in FIG. 7(B), one or both of electrodes 127E1 and 1272 are controlled by way of an actuation signal $V_{ACT}$ transmitted from control circuit 150E, whereby electrodes 127E1 and 127E2 generate an electrostatic force $F_{ES}$ that pulls actuation arm 123A1 downward, thereby causing movable electrode 122A to contact fixed electrode 125A. FIG. 8 illustrates another IC device 90F including a hybrid MEMS-FG device 100F disposed under a rigid cover 160F that prevents mechanical actuation, with a sensing element 171F (e.g., one of a thermal sensor, a capacitive sensor, an ultrasonic sensor and an optical sensor) disposed to control actuation of MEMS switch 120E (described above with reference to FIGS. 7(A) and 7(B)) by way of a pre-amplifier 173F, a select transistor 175F and filter resistor 177F. In a specific embodiment, sensing element 171F is a thermal sensing element formed on a thermally isolated from the bulk membrane having a low thermal mass. For example, thermal sensing element 171F may be formed on the thin (100 nm-5000 nm) device layer of an SOI wafer, while the bulk silicon is further etched off to make an opening under the thermal sensing element (e.g., by using the bottom oxide of the SOI as an etch stop). Low thermal conductivity paste can be introduced in the opening to make the device mechanically robust while keeping low thermal inertness. In alternative embodiments, the thermal sensing element includes one of a temperature sensitive MOS on SOI (TMOS) device, a nanowire, and a thermistor formed on Vanadium-dioxide ($VO_2$). In another embodiment, hybrid MEMS-FG device 100F includes both thermal sensing element 171F and a micro heating element 172F that are utilized in combination in the manner described above (see Han et al., "Thermal Analysis of Fingerprint Sensor . . . ", cited above). By combining hybrid MEMS-FG device 100F with sensor 171F and micro heater element 172F in the manner shown in FIG. 8, the resulting assembly incorporates the additional benefits provided by the selected sensor type (e.g., the ability to distinguish between real and phantom fingerprints provided by thermal sensors) with the advantages associated with the use of hybrid MEMS-FG devices that are mentioned above.

Figure 9:
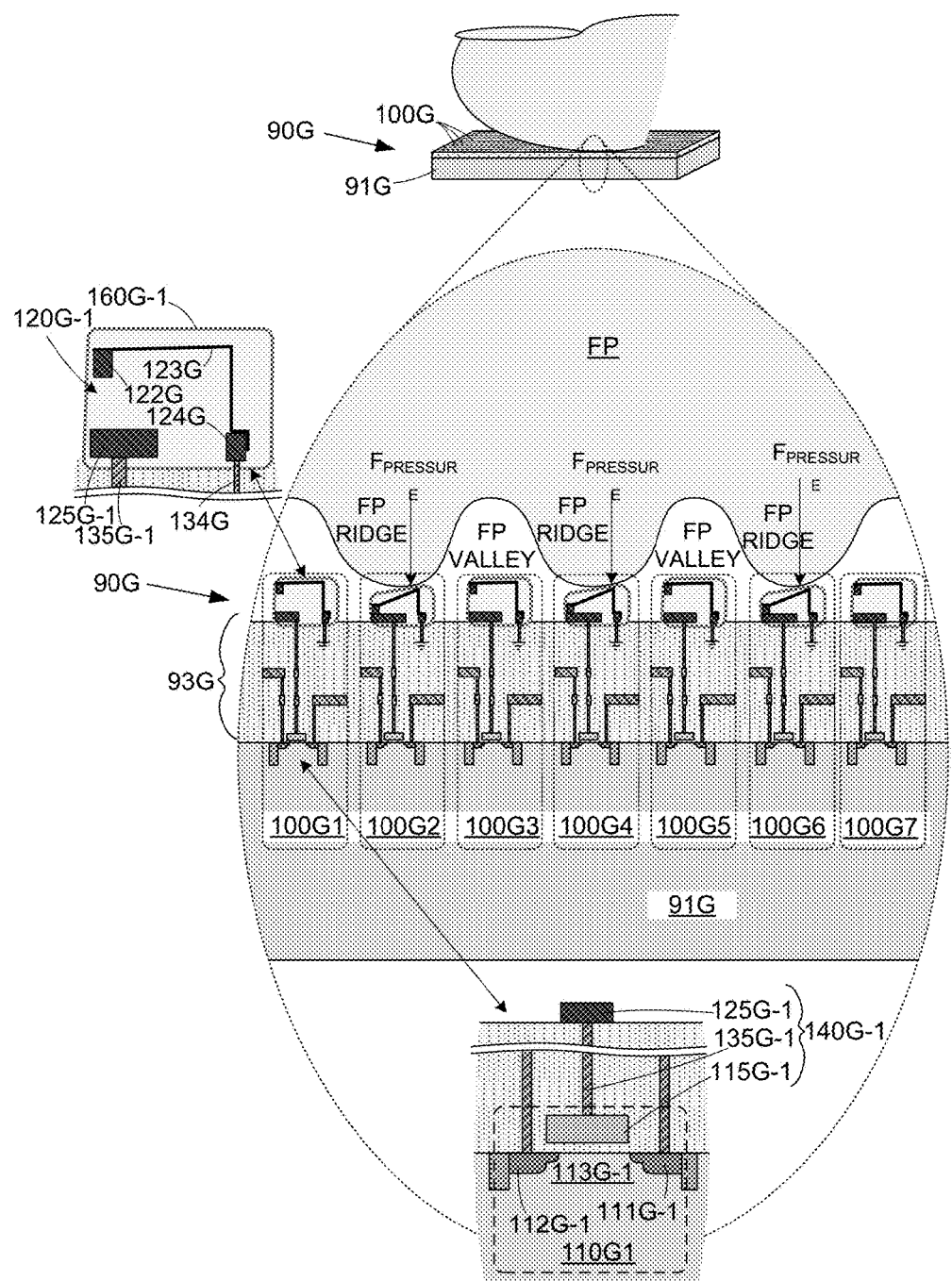
FIG. 9 is a simplified cross-sectional side view showing a fingerprint sensor utilizing an array of hybrid MEMS-FG devices according to another specific embodiment of the present invention.

FIG. 9 shows a fingerprint sensor 90G according to another embodiment of the present invention. Referring to the uppermost portion of FIG. 9, fingerprint sensor 90G includes a two-dimensional (2D) array of pixels (hybrid MEMS-FG devices) 100G formed on a substrate 91G. The large bubble in FIG. 9 shows an enlarged portion of sensor 90G including a row of pixels 100G1 to 100G7, where each pixel includes an electrically isolated structure, an NVM cell and a MEMS switch consistent with a hybrid MEMS-FG device of at least one the embodiments described above. For example, as indicated at the lower portion of the large bubble, pixel 100G1 includes an NVM cell 110G1 consisting of drain region 111G-1 and source region 112G-1 separated by channel region 113G-1 and controlled by polysilicon gate structure 115G-1, and an electrically isolated non-volatile memory (floating) structure 140G-1 formed by polysilicon gate structure 115G-1, a metal via structure 135G-1 connected at its lower end to polysilicon gate structure 115G-1 and extending through metallization layer 93G, and a fixed electrode 125G-1 disposed on the upper surface of metallization 93G and fixedly connected to an upper end of metal via structure 135G-1. As indicated in the upper left portion of FIG. 9, pixel 100G1 also includes a normally-open MEMS switch 120G-1 disposed on metallization layer 93G and including a movable electrode 122G operably mounted on an actuating arm (member) 123G over fixed electrode 125G-1 and coupled to ground/VSS by way of a source electrode 124G and a metal contact 134G. In this case, each MEMS switch of pixels 100G1 to 100G7 is covered by a flexible membrane (see, e.g., flexible membrane 160G-1 disposed over MEMS switch 120G-1) in the manner described above with reference to FIG. 6(A) such that the MEMS switches of pixels 100G are actuated when subjected to a pressure force $F_{PRESSURE}$ deformed by an applied pressure force contacted by an FP ridge when a fingerprint FP is placed on a surface of sensor 90G.

Figure 10A:
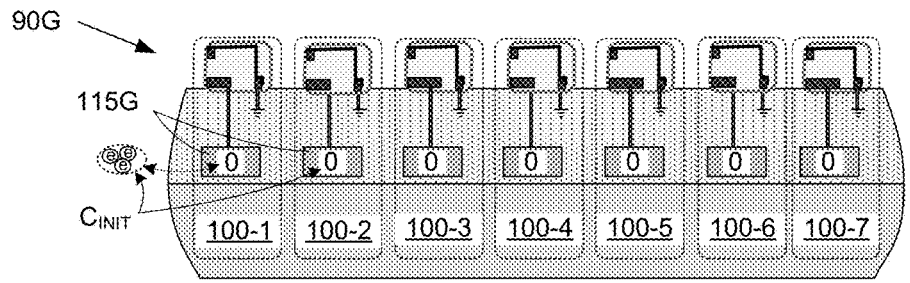
FIGS. 10(A), 10(B) and 10(C) are simplified cross-sectional side view showing the fingerprint sensor of FIG. 9 during operation.
Figure 10B:
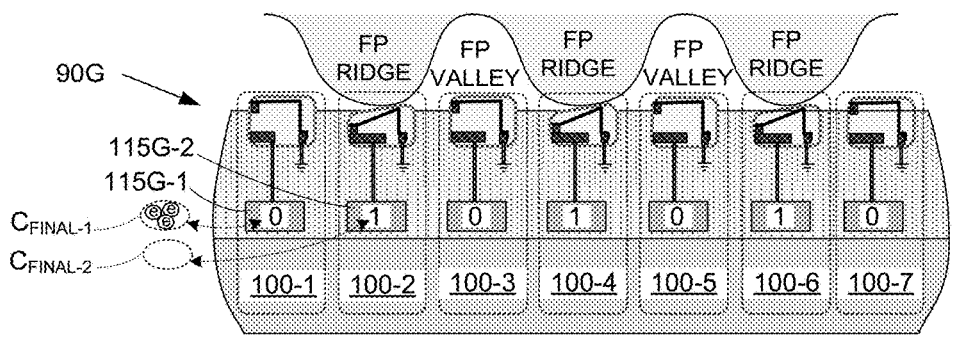
Figure 10C:
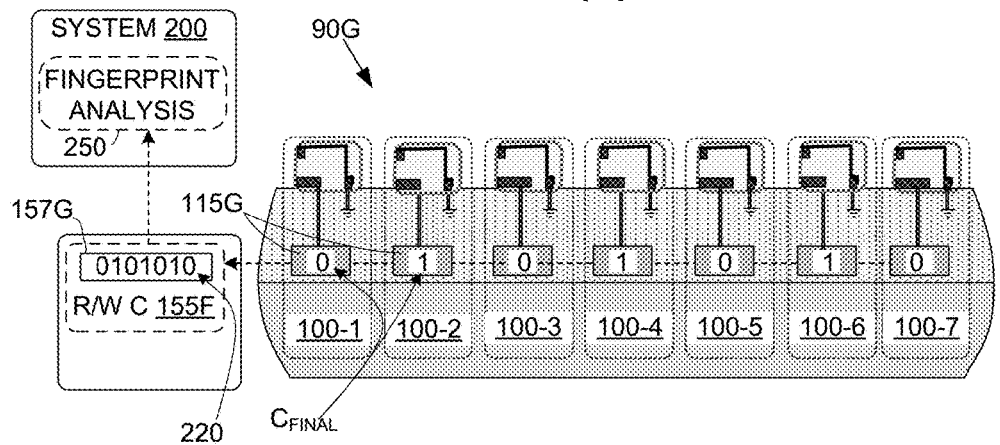

FIGS. 10(A) to 10(C) illustrate a method for recording non-secure FP image data directly onto electrically isolated, non-volatile memory structures of each pixel 110G1 to 110G7 (e.g., floating structure 140G-1 of pixel 100G1, see FIG. 9) during a FP imaging (sensing) operation period using sensor 90G. Referring to FIG. 10(A), during an initialization phase an initial value (e.g., binary "0") is written onto the floating structures of each pixel 100G1 to 100G7 (i.e., by way of transferring initial charge $C_{INIT}$ onto each polycrystalline gate structures 115G in the manner described above). During a subsequent FP imaging period, a finger is placed onto sensor 90G such that some of the pixels are actuated by pressure contact, and other pixels remain non-actuated. For example, as indicated in FIG. 10(B), pixels 100G2, 100G4 an 100G6 are contacted by FP ridges, whereby the MEMS switches of these pixels are actuated, resulting in discharge of the initial charge stored on the floating structures in these pixels, thereby changing the logic value stored on these pixels (e.g., the final charge $C_{FINAL-2}$ stored on gate 115G-2 of pixel 100G2 indicates that the applied initial charge has been discharged, whereby the logic value stored on pixel 100G2 is changed to logic "1"). Conversely, pixels 100G1, 100G3, 100G5 an 100G7 are aligned with FP valleys, whereby the MEMS switches of these pixels are not actuated, and the initial charges stored on the floating structures in these pixels is retained (e.g., final charge CFINAL-1 stored on gate 115G-1 of pixel 100G1 retains its initial charge and logic value, as indicated by the logic "0"). As indicated in FIG. 10(C), after the FP imaging period, FP image data values 220 are read out of pixels 100G1 to 100G7 by way of reading final charges $C_{FINAL}$ stored on polysilicon gate structure 115G of each hybrid MEMS-FG device using a read/write circuit 155G operated as described above. As indicated in the right side of FIG. 10(C), FP image data values 220 may then be transferred to a processor (external system) 200 for FP identification processing using known techniques. An advantage of the methodology shown in FIGS. 10(A) to 10(C) is that FP image data 220 (or data characterizing another short duration measured stimuli) is non-volatilely directly written (captured) on the floating structures of pixels 100G1 to 100G7, whereby the FP image data can be read out at any rate and at any time subsequent to the FP imaging operation, even after an imaged finger has been removed from sensor 90G.

Figure 11:
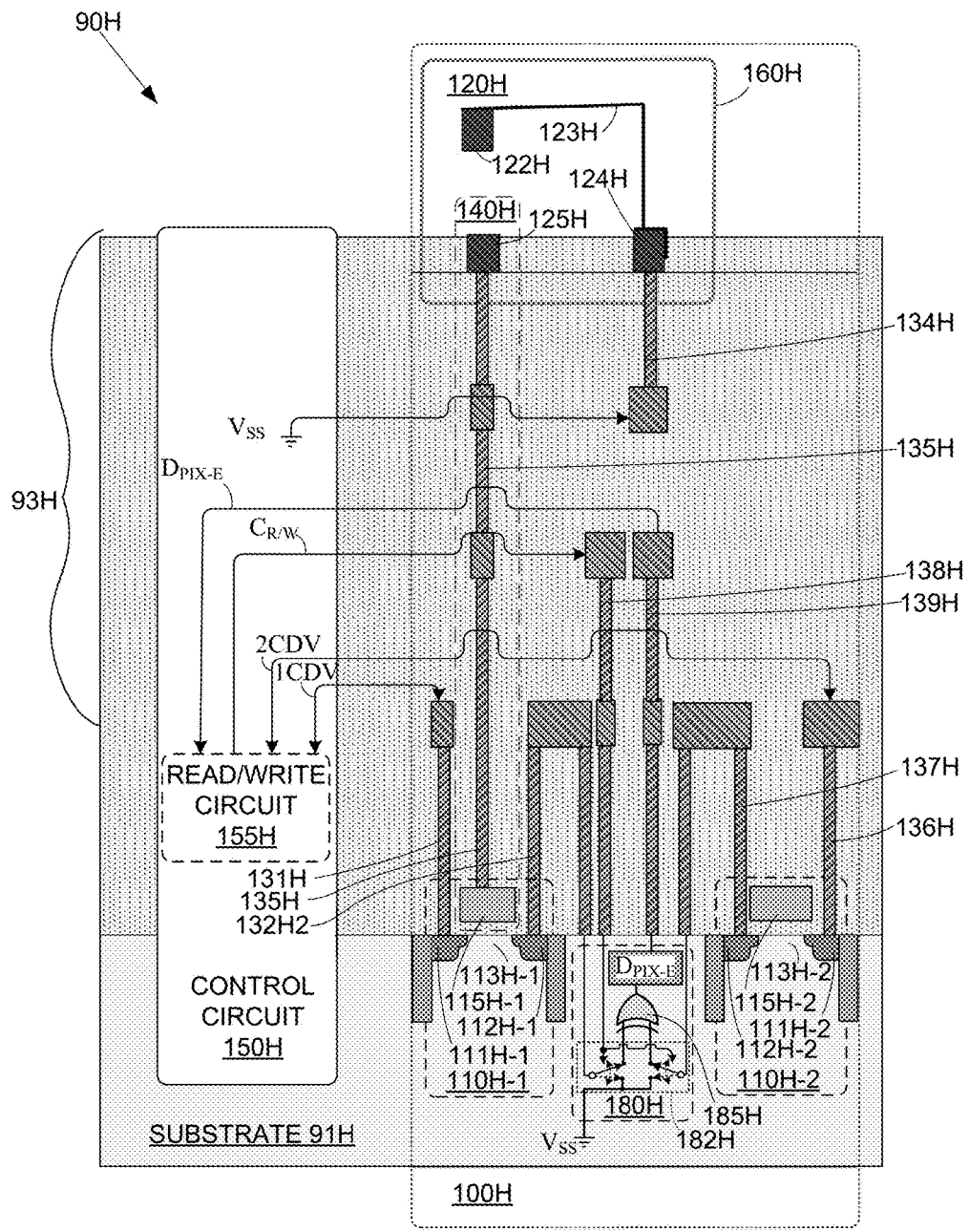
FIG. 11 is a simplified cross-sectional side view showing an IC including a differential-NVM-type hybrid MEMS-FG device according to another specific embodiment of the present invention.

FIG. 11 shows an IC 90H including differential-NVM-type hybrid MEMS-FG device 100H according to another embodiment of the present invention. Similar to the embodiments set forth above, device 100H includes a (first) NVM cell 110H-1, a MEMS switch 120H and a floating structure 140H. NVM cell 110H-1 includes a (first) drain region 111H-1 and a (first) source region 112H-1 separated by a (first) channel region 113H-1 that are formed in a semiconductor substrate 91H, and a (first) polycrystalline silicon gate structure 115H-1 formed over channel region 113H-1 and disposed between substrate 91H and a metallization layer 93H. MEMS switch 120H includes a movable electrode 122H movably disposed on an actuation arm 123H over a fixed electrode 125H, which is fixedly formed on metallization layer 93H. As in previous embodiments, fixed electrode 125H is electrically connected to polysilicon gate structure 115H-1 by way of a metal via structure 135H such that polysilicon gate structure 115H-1 and fixed electrode 125H form electrically isolated (floating) structure 140H. In the disclosed embodiment, MEMS switch 120H is covered by a flexible membrane 160H that functions in the manner described above with reference to FIG. 9. As indicated on the left side of FIG. 11, IC 90H also includes a control circuit 150H having a read/write circuit 155H that is configured to control NVM cell 110H-1 in the manner explained below by way of a (first) drain control signal 1CDV transmitted on metal structure 131H. Control circuit 150H also provides a ground potential VSS to source electrode 124H of MEMS switch 120H by way of metal structure 134H.

Device 100H differs from the embodiments set forth above in that it also includes a "normal" security (second) NVM cell 110H-2 and an encryption circuit 180H that is connected to the drain terminals of NVM cells 110H-1 and 110H-2. As set forth below, when a sensor is fabricated that implements multiple devices 100H as sensor pixels, each security NVM cell 110H-2 and each encryption circuit 180H are fabricated in the same pixel area as associated floating structure 140H, whereby each security NVM cell 110H-2 is disposed adjacent to an associated electrically isolated, non-volatile memory (floating) structure 140H.

As indicated on the lower right side of FIG. 11, security NVM cell 110H-2 includes a (second) drain region 111H-2 and a (second) source region 112H-2 that are formed in substrate 91H and separated by a (second) channel region 113H-2, and a (second) polysilicon gate structure 115H-2 formed over channel region 113H-2. Unlike NVM cell 110H-1, polysilicon gate structure 115H-2 is of a "normal" floating gate type (i.e., it is entirely surrounded by insulating material and not connected to any metallization structures). As indicated on the left side of FIG. 11, read/write circuit 155H is configured to control NVM cell 110H-2 in the manner explained below by way of a (second) drain control signal 2CDV transmitted on metal structure 136H.

Encryption circuit 180H has input terminals respectively coupled to source terminal 112H-1 of NVM cell 110H-1 by way of a metal structure 132H and to source terminal 112H-2 of NVM cell 110H-2 by way of a metal structure 137H, a control terminal coupled to receive a read/write control signal $C_{R/W}$ from read/write circuit 155H by way of a metal structure 138H, and an output terminal coupled to transmit an encoded pixel (data) value $D_{PIX-E}$ to read/write circuit 155H by way of a metal structure 139H. Encryption circuit 180H also includes a control portion 182H and a logic circuit 185H, which in the exemplary embodiment is implemented using an exclusive-OR (XOR) logic gate. Control portion 182H is configured to couple source terminals 112H-1 and 112H-2 to ground in response to a "write" (first) state of read/write control signal $C_{R/W}$, and configured to couple source terminals 112H-1 and 112H-2 to input terminals of XOR logic gate 185H in response to a "read" (second) state of read/write control signal $C_{R/W}$. With this arrangement, encryption circuit 180H is configured to generate encoded data value $D_{PIX-E}$ based on a logical combination (i.e., XOR) of a first charge/bit stored on polysilicon gate structure 115H-1, which is generated in response to actuation/non-actuation of MEMS switch 120H as described below, and a security (second) charge stored on polysilicon gate structure 115H-2. Encoded pixel value $D_{PIX-E}$ is generated at the output terminal of XOR logic gate 185H, and is transmitted to read/write circuit 155H by way of metal structure 139H.

Figure 12A:
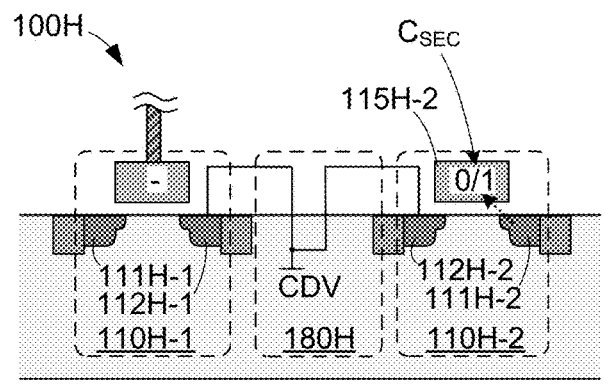
FIGS. 12(A) and 12(B) are simplified cross-sectional side view showing initialization of the differential-NVM-type hybrid MEMS-FG device of FIG. 11.
Figure 12B:
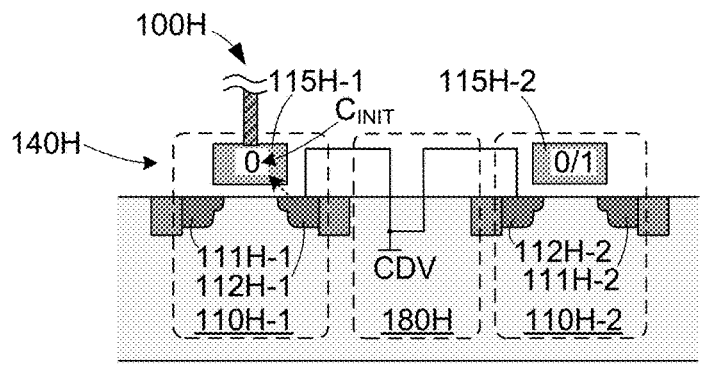

FIGS. 12 (A) and 12(B) illustrate simplified NVM operations utilized to initialize device 100H during operation of IC 90H, where FIG. 12(A) depicts initialization of security NVM cell 110H-2 by way of writing/storing a security charge (or security bit) $C_{SEC}$ on floating gate structure 115H-2 during a first time period, and FIG. 12(B) depicts initialization of floating gate structure 140H by way of writing/storing initial charge $C_{INIT}$ on polysilicon gate structure 115H-1 subsequent to the first time period, and before a sensing operation period.

Referring to FIG. 12(A), writing/storing security charge (bit) $C_{SEC}$ on floating gate structure 115H-2 involves generating programming voltage $V_{PROG}$ that is applied between the terminals of capacitors coupled to the FG (not shown in FIG. 12). Note that security charge/bit $C_{SEC}$ is written either as a logic "1" or a logic "0" (indicated in FIG. 12(A) as "0/1" in the box depicting floating gate structure 115H-2), where the actual value is securely stored on an authorized system in order to decrypt an encoded data value generated by device 100H after a subsequent sensing/imaging operation. When it is intended for security NVM cell 110H-2 to store security charge/bit having a logic "1" value, no voltage is applied to the programming capacitors coupled to 115H2 floating gate, thus floating gate structure 115H-2 maintains a discharged state. As indicated in FIG. 12(A), floating gate structure 115H-1 also maintains a discharged or non-determinate state (indicated by "-"). Note that security charge $C_{SEC}$ stored on floating gate structure 115H-2 need only be written once (e.g., under secure conditions established during manufacture or when connected to an authorized system), and can then be utilized to encrypt sensor/image data obtained during multiple sensing/imaging operations in the manner described below. In other embodiments, security charge $C_{SEC}$ can be overwritten on a predetermined schedule (e.g., before sensing/imaging operation), but in this case additional control circuitry (not shown) would be required. In some embodiments it may be possible to write the security charge $C_{SEC}$ on security NVM cell 110H-2 after storing the initial charge $C_{INIT}$ on floating structure 140H.

FIG. 12(B) illustrates a portion of the initialization phase that is performed before each sensing/imaging operation, and involves writing/storing initial charge $C_{INIT}$ on floating structure 140H using a methodology similar to that set forth above. Specifically, initializing floating structure 140H includes generating control source signal such that it applies programming voltage $V_{PROG}$ to the two capacitors of 115H1 by way of encryption circuit 180H, thereby transferring electrons to gate structure 115H-1 by way of Fowler-Nordheim tunneling. The charged state (i.e., the stored logic "0" value) generated by initial charge $C_{INIT}$ at the end of each pre-sensing/image initialization period is indicated by the "0" bit value provided on polysilicon gate structure 115H-1 in FIG. 12(B).

Figure 13A:
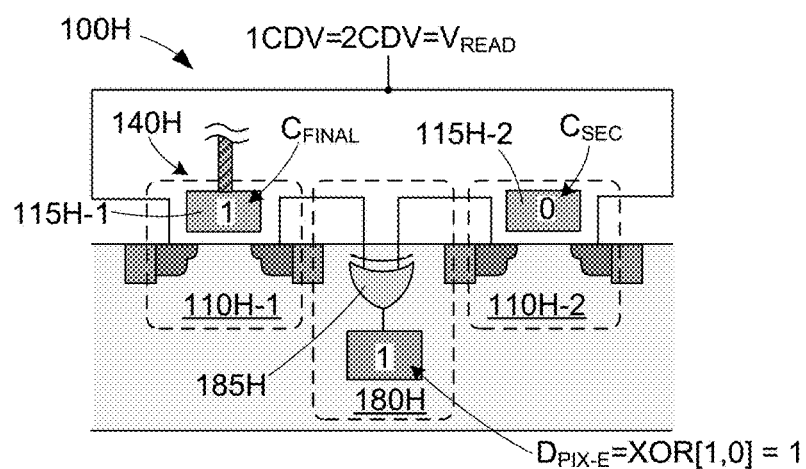
FIGS. 13(A), 13(B), 13(C) and 13(D) are simplified cross-sectional side view showing alternative readout operations of the differential-NVM-type hybrid MEMS-FG device of FIG. 11.
Figure 13B:
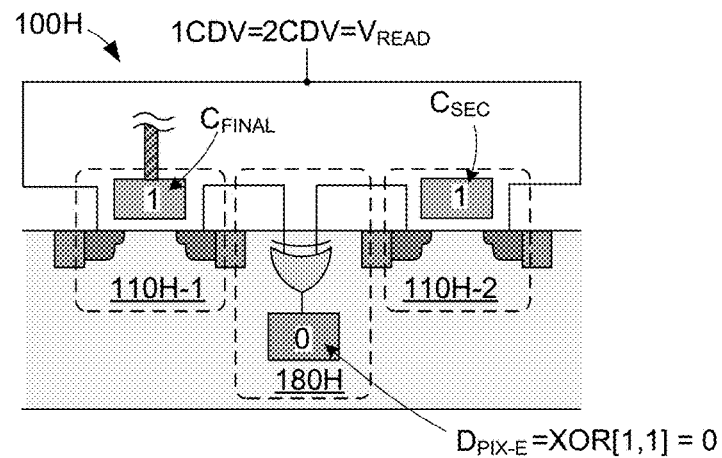
Figure 13C:
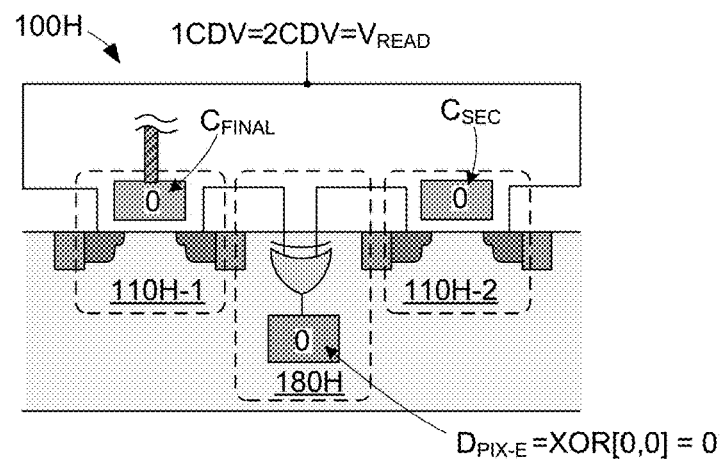
Figure 13D:
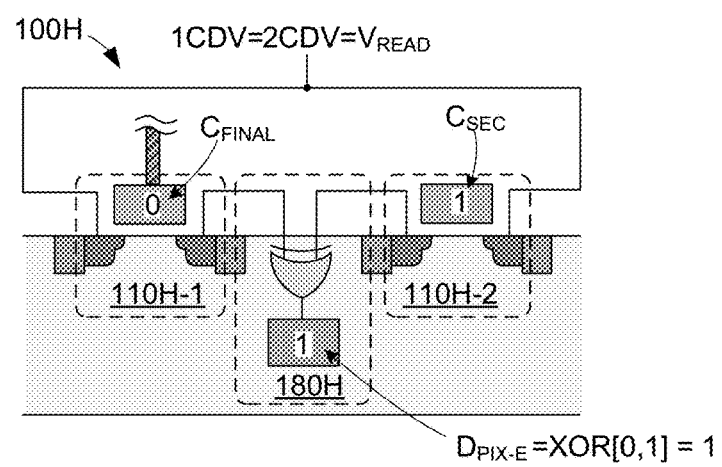

FIGS. 13(A) to 13(D) depict reading a final charge $C_{FINAL}$ generated/stored on floating structure 140H after a sensing/imaging operation by way of logically combining final charge $C_{FINAL}$ and security charge/bit value $C_{SEC}$ stored on security NVM cell 110H-2 to generate an associated encoded data value $D_{PIX-E}$. As indicated in FIG. 13(A), this differential readout operation is performed by way of generating control signals 1CDV and 2CDV with a suitable read voltage $V_{READ}$, and by way of transmitting a suitable read/write control signal to encryption circuit 180H (e.g., by way of control voltage $C_{R/W}$, shown in FIG. 9) such that encryption circuit 180H couples source regions 112H-1 and 112H-2 to input terminals of XOR gate 185H. In this operating state, a "sensed" logic value based on final charge $C_{FINAL}$ (e.g., logic "0" if a non-actuation event occurred during the sensing/imaging period, and a logic "1" if an actuation event occurred during the sensing/imaging period) is applied to one input terminal of XOR gate 185H, and a security bit value based on security charge $C_{SEC}$ is applied to the other input terminal of XOR gate 185H. Encoded data value $D_{PIX-E}$ is thus generated with a logic value that is determined by the logical XOR combination of the logic values passed from NVM cells 110H-1 and 110H-2 to XOR gate 185H. Referring to FIG. 13(A), when final charge $C_{FINAL}$ generates a logic "1" value and security charge $C_{SEC}$ generates a logic "0" value, encoded data value $D_{PIX-E}$ is generated as the logic XOR of "1" and "0", which equals "1". Referring to FIG. 13(B), when final charge $c_{FINAL}$ stored on NVM cell 110H-1 generates a logic "1" value and security charge $C_{SEC}$ stored on NVM cell 110H-2 generates a logic "1" value, encoded data value $D_{PIX-E}$ is generated by encryption circuit 180H has the logic value "0". Referring to FIG. 13(C), when final charge $C_{FINAL}$ stored on NVM cell 110H-1 generates a logic "0" value and security charge $C_{SEC}$ stored on NVM cell 110H-2 generates a logic "0" value, encoded data value $D_{PIX-E}$ is generated by encryption circuit 180H has the logic value "0". Finally, as shown in FIG. 13(D), when final charge $C_{FINAL}$ stored on NVM cell 110H-1 generates a logic "0" value and security charge $C_{SEC}$ stored on NVM cell 110H-2 generates a logic "1" value, encoded data value $D_{PIX-E}$ is generated by encryption circuit 180H has the logic value "1".

An advantage provided by differential-NVM-type hybrid MEMS-FG device 100H is that it facilitates transmitting only encoded data that can be subsequently decoded by a host system (or other data receiving circuit) using the applied security bit or bits. In one embodiment, subsequent decryption of encoded data values is achieved, for example, by way of logically combining (e.g., XORing) each encoded data value with the security bit used to encrypt the "raw" sensor data read from floating structure 140H. For example, to decode the encoded value generated in the example illustrated in FIG. 13(A), encoded data value $D_{PIX-E}$ (i.e., "1") is XORed with security bit "0" to provide "raw" sensor data value "1". Similarly, the encoded value "0" generated in the example illustrated in FIG. 13(B) is decoded by XORing with security bit "1" to provide "raw" sensor data value "1", the encoded value "0" generated in the example illustrated in FIG. 13(C) is decoded by XORing with security bit "0" to provide "raw" sensor data value "0", and the encoded value "1" generated in the example illustrated in FIG. 13(D) is decoded by XORing with security bit "1" to provide "raw" sensor data value "0".

Figure 14A:
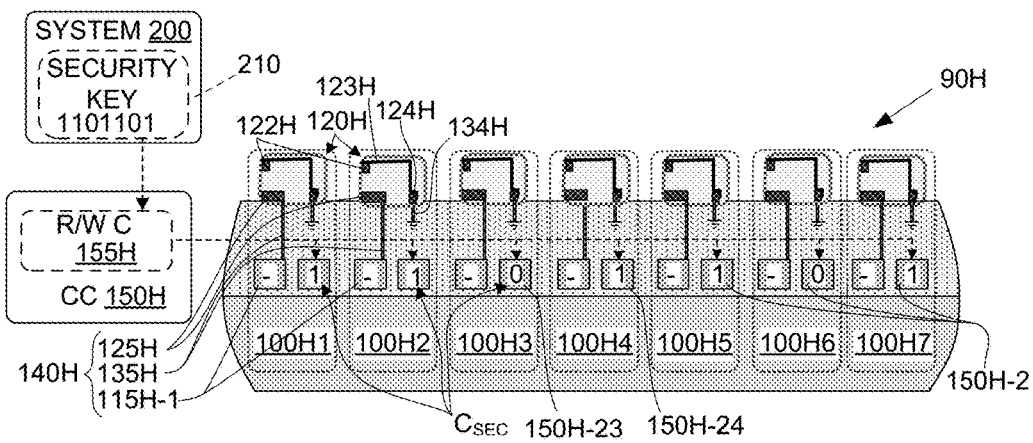
FIGS. 14(A), 14(B), 14(C) and 14(D) are simplified cross-sectional side view showing operation of a fingerprint sensor comprising an array of the differential-NVM-type hybrid MEMS-FG device of FIG. 11 during operation.

FIG. 14(A) depicts a secure FP sensor array 90H according to another embodiment of the present invention. FP sensor array 90H includes differential NVM pixels arranged in a 2D array pattern similar to that shown at the top of FIG. 9, with each differential NVM pixel (e.g., pixels 110H1 to 110H7) being configured to include one differential-NVM-type hybrid MEMS-FG device as depicted in FIG. 11. In particular, as indicated in FIG. 14(A) each differential NVM pixel 100H1 to 100H7 includes an electrically isolated structure 140H formed by a fixed electrode 125H fixedly electrically connected to an associate first floating gate structure 115H-1 by way of a metal via structure 134H, where the fixed electrode 125H is part of a normally open MEMS switch 120H. FP sensor array 90H also includes and a control circuit 150H configured similar to that shown in FIG. 11, where read/write circuit (R/W C) 155H is configured to sequentially write data values to and read encoded values from the array of differential NVM pixels 110H1 to 110H7.

A method for generating and transmitting secure fingerprint data will now be described with reference to FIGS. 14(A) to 14(D). The method is described in simplified form with reference to the operation of FP sensor array 90H, with specific reference to operations performed on differential NVM pixels 110H1 to 110H7. Those skilled in the art will understand the principles set forth below may be repeated over a large area to obtain suitably complete FP scan data that can be utilized to perform FP identification.

Referring to FIG. 14(A), before secure fingerprint data can be generated, one or more bits of a security key are written to (stored on) second floating gate structures 115H-2 of pixels 100H1 to 100H7. In the depicted embodiment, a portion of a security key 210 (e.g., a template or watermark image, which is represented in the simplified example by arbitrary binary series "1101101") is transmitted from a host system 200 to control circuit 150H of sensor array 90H, whereby it is written by way of read/write circuitry 155H into pixels 110H1 to 110H7 using the data writing methods mentioned above such that one bit of security key 210 is stored on each second FG structure 115H-2 of each pixel 110H1 to 110H7. For example, a binary "0" security bit is stored in pixel 110H3 by way of generating a charge on second FG structure 115H-23 using the techniques described above, and a binary "1" is stored in pixel 110H4 by way of erasing or discharging second FG structure 115H-24. A preliminary recorded FP can be used as such a template. Because the security bits are stored in a non-volatile fashion on second FG structures 115H-2, security key 210 is effectively permanently stored on sensor array 90H until it is optionally overwritten by a new (different) security key transmitted from system 200. That is, after a particular security key (e.g., security key 210) is stored on sensor array 90H, that particular security key is utilized by sensor array 90H during all subsequent FP scan (sensing) operations to encode captured FP scan data in the manner set forth below. Note that, by retaining a copy of security key 210, system 200 is able to decode (decrypt) all FP scan data generated by sensor array 90H while security key 210 is stored in pixels 110H1 to 110H7. In one embodiment, a single unique security key is transmitted to from system 200 to sensor array 90H under secure conditions, and all FP scan operations performed by sensor array 90H during its operating lifetime are encrypted using the single unique security key. In alternative embodiments, multiple security keys are stored in control circuit 150H of sensor array 90H, and the security bits stored on pixels 110H1 to 110H7 are periodically overwritten on a predetermined schedule (e.g., after each FP scan operation, or after a predetermined number of FP scan operations).

Figure 14B:
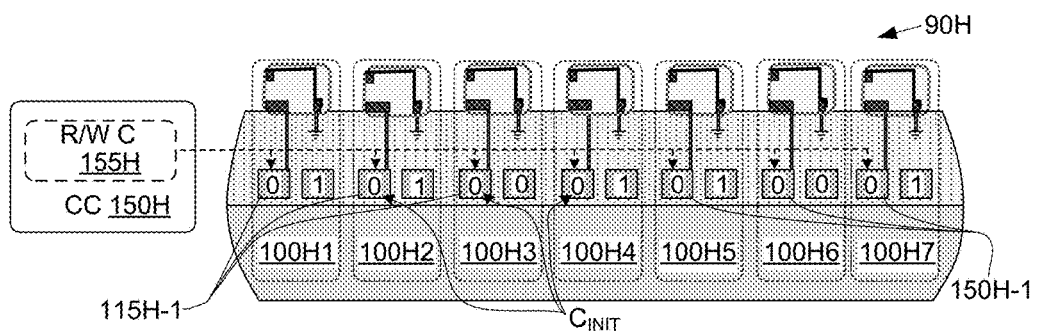

FIG. 14(B) depicts sensor array 90H during an initialization process that is performed prior to each FP scan operation in a manner similar to that described above with reference to FIG. 10(A). That is, an initial charge $C_{INIT}$ (i.e., a binary "0" value) is stored on electrically isolated structures 140H of differential NVM pixels 110H1 to 110H2 by way of operating each first NVM cell 110H-1 to transfer initial charge $C_{INIT}$ onto its first floating gate structure 115H-1 in the manner described above. As mentioned above, each initial charge $C_{INIT}$ has a charge value selected such that the stored charge becomes discharged (i.e., the stored value switches from binary "0" to binary "1") when an associated MEMS switch 120H is actuated as described below. In one embodiment, the initialization process is performed after a preliminary signal (e.g. touching the screen of smart-phone) is provided to array 90H, and requires that a finger be applied to the surface of FP sensor array 90H within several seconds after initiation in order to assure capturing data while the initial charges are stored on the electrically isolated structures of all of the pixels.

Figure 14C:
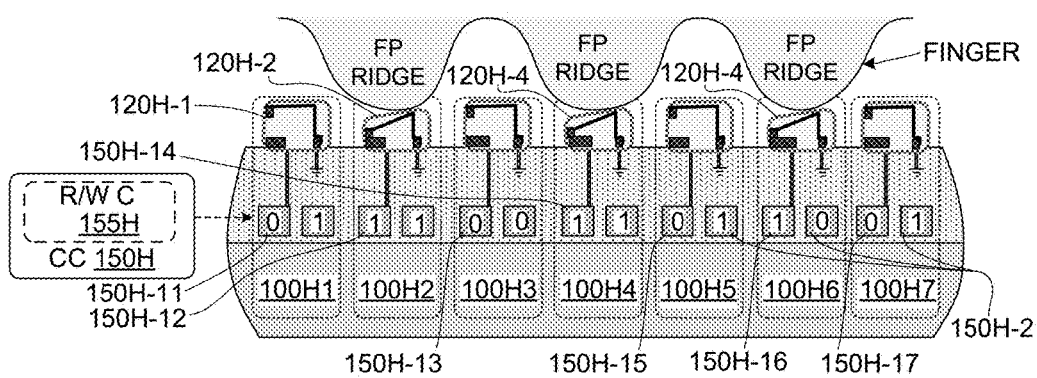

FIG. 14(C) depicts an exemplary FP scan operation in which FP ridges apply pressure-type actuating forces ($F_{PRESSURE}$) are pressed against MEMS switches 120H of differential NVM pixels 110H1 to 110H7. Note that movable electrodes 122H in each pixel 110H1 to 110H7 are connected or coupled to ground (voltage source $V_{SS}$) in order to perform the FP identification operation. When a finger is operably placed on FP sensor array 90H, the finger's FP ridges press against flexible membranes covering associated MEMS switches in a pattern corresponding to the finger's fingerprint pattern (i.e., flexible membranes that are aligned with FP valleys of the fingerprint are not deflected). For example, the flexible membranes of MEMS switches 120H-2, 120H-4 and 120H-6 are aligned with and contacted by associated FP ridges, and are therefore depicted in FIG. 14(C) as being deflected, whereas the flexible membranes of MEMS switches 120H-1, 120H-3, 120H-5 and 120H-7 are aligned with associated FP valleys, and are therefore depicted in FIG. 14(C) as not deflected. Each MEMS switch that is contacted by an FP ridge is actuated (i.e., the switch's movable electrode is deflected downward to make ohmic contact with the switch's fixed electrode), resulting in discharge of the initial charge from the corresponding first FG structure to ground/$V_{SS}$. For example, the binary value stored in first FG structures 115H-12, 115H-14 and 115H-16 of pixels 110H2, 110H4 and 110H6, respectively, are changed from "0" to "1" in response to the actuation of MEMS switches 120H-2, 120H-4 and 120H-6. Conversely, because flexible membranes of MEMS switches 120H-1, 120H-3, 120H-5 and 120H-7 were not actuated, initial values "0" are retained by pixels 110H1, 110H3, 110H5 and 110H7 (e.g., first FG structures 115H-11, 115H-13, 115H-15 and 115H-17 retain their initial charge, as indicated by the binary "0" values in FIG. 14(C)). Thus, sensor array 90H captures and directly stores into the first NVM cells an FP image corresponding to the pattern of MEMS switches that are actuated by the applied finger's FP ridges. Note that the security bits stored in second FG structures 115H-2 are not changed during the FP scan operation.

Figure 14D:
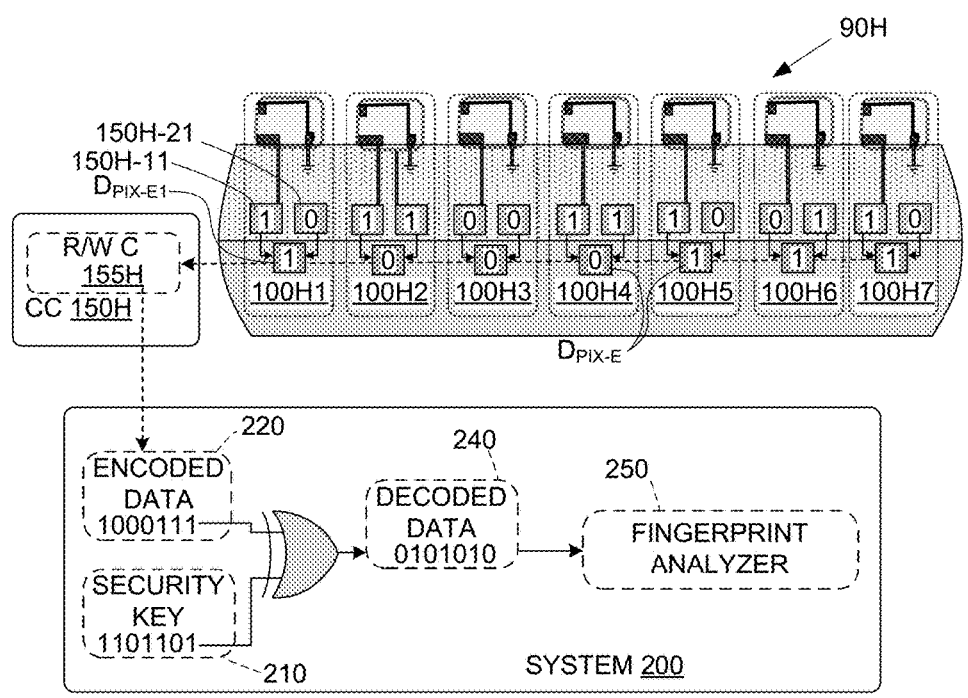

FIG. 14(D) depicts subsequent readout of secure FP data from FP sensor array 90H. As mentioned above, the subsequent readout can be performed even after the finger is no longer touching FP sensor array 90H. During readout, encoded pixel (data) values are generated by each pixel 100H1 to 100H7, where each encoded pixel value is determined by logically or otherwise combining each pixel's security key bit stored on its second FG structure and the final charge stored on its first FG structure using each pixel's readout circuit (e.g., readout circuit 180H shown in FIG. 11). For example, when each pixel's readout circuit comprises an exclusive-OR logic gate configured as described above with reference to FIG. 11, encoded data value $D_{PIX-E1}$ generated by pixel 110H1 is equal to the result of the binary logic operation "1 XOR 0", which is binary "1". As indicated in FIG. 14(D), each pixel 110H2 to 110H7 generates an associated encoded pixel value. As indicated, the generated encoded pixel values are then transmitted as encoded data 220 by way of read/write circuit 155H to system 200, where they are subsequently decoded (e.g., by way of XORing each encoded data bit with an associated security bit of security key 210) to generate decoded FP scan data 240, which is then passed to a processor (FP analyzer) 250 for FP identification. Because encoding of the FP data is performed at each pixel, FP sensor array 90H provides the added security advantage by never transmitting decoded FP data (i.e., either from the pixels to read/write circuit 155H, or from reach/write circuit 155H to system 200).

Although the secure FP data generation and transmission method described above is described with particular reference to the use of hybrid MEMS-FP devices, the methodology may also be utilized in accordance with other FP data capture technologies as well. That is, the process of transmitting security key 210 from external system 200 to FP sensor 90H such that at least one bit is stored on at least one corresponding (second) FG structure 115H-2 of each pixel, as described above with reference to FIG. 14(A), may be utilized in conjunction with a different FP sensor array (i.e., including an FP sensing mechanism other than the hybrid MEMS-FP devices illustrated in FIGS. 14(A) to 14(D)). In this alternative case, fingerprint scan operations would be performed in a manner that generates decoded pixel values in a volatile state (i.e., as opposed to the non-volatile state provided by the electrically isolated structures of the hybrid MEMS-FG devices described above), where each volatile decoded pixel value corresponds to an applied fingerprint feature (i.e., such that the decoded pixel value $D_{PIX-D}$ generated by each pixel has a first value (e.g., binary "1") when the pixel is aligned with a fingerprint ridge, and has a second value (e.g., binary "0") when the pixel is aligned with a fingerprint valley). Similar to the example described above with reference to FIG. 14(D), each volatile decoded pixel value would then be combined (e.g., XORed) with the security bit stored on a corresponding (second) NVM cell of each pixel before transmission. Although this methodology provides the enhanced security benefits described above (i.e., decoded FP data is never transmitted between the pixels and the FP analyzer circuit), it fails to benefit from the non-volatile capture of decoded data provided by hybrid MEMS-FP devices, and therefore is considered inferior to the approach described above with reference to FIGS. 14(A) to 14(D).

For commercially practical purposes, the NVM cells and MEMS switches of the various sensors described above must exhibit significant endurance. For example, if an advanced cell phone utilizing FP sensor array 90H is switched thirty times a day, an endurance of at least 100 k cycles is necessary. Those skilled in the art understand that existing single poly CMOS fabrication flows may be utilized to generate NVM cells that can be programmed/erased by Fowler-Nordheim mechanisms and also exhibit >100 k cycle endurance levels. Moreover, ohmic contact switches produced using exiting MEMS fabrication technologies and having lifetimes of up to few million cycles have been demonstrated (see, e.g., G. M. Rebeiz, et. al. "The Search for a Reliable MEMS Switch", IEEE Microwave Magazine, 2013). Process flows combining single-poly CMOS techniques and MEMS-type fabrication techniques are known in the art. Accordingly, the various hybrid MEMS devices, sensors/pixels and arrays described above (e.g., FP sensor array 90H) are currently producible using existing semiconductor fabrication technologies, meaning that they are producible at a relatively low cost. Moreover, even if several pixels in a sensor array fail to achieve the required number of cycles, their loss would not significantly influence an FP identification algorithm. Accordingly, the present invention provides sensors (e.g., FP sensor array 90H) that are low-cost, practical, reliable and durable alternatives that address the various deficiencies of conventional sensors described above.

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. An integrated circuit (IC) including a metallization layer formed over a semiconductor substrate, the IC including at least one hybrid Micro-Electro-Mechanical-System-Floating-Gate (MEMS-FG) device comprising:
    a memory cell including a first source region and a first drain region formed in the semiconductor substrate, and a first gate structure formed between the semiconductor substrate and the metallization layer and disposed over a first channel region separating the first source region and the first drain region;
    a MEMS switch disposed on the metallization layer and including a movable electrode and at least one fixed electrode, the MEMS switch being configured such that said movable electrode is disposed away from the fixed electrode in the absence of an actuating force, and such that the movable electrode abuts the fixed electrode when the MEMS switch is subjected to said actuating force; and
    a metal structure fixedly connected between the gate structure and the fixed electrode, said metal structure extending through the metallization layer,
    wherein the gate structure, the metal structure and the fixed electrode collectively form an electrically isolated structure.

2. The IC of claim 1, wherein the gate structure comprises a patterned portion of a single polycrystalline silicon layer disposed between the metallization layer and the semiconductor substrate.

3. The IC of claim 1, wherein the fixed electrode comprises a patterned portion of an uppermost metal layer of said metallization layer.

4. The IC of claim 1, wherein the MEMS switch comprises one of a lever-type ohmic switch and a membrane-type ohmic switch.

5. The IC of claim 1, wherein at least one of the fixed electrode and the movable electrode comprise Ruthenium.

6. The IC of claim 1, wherein the IC further comprises a write control circuit configured to generate a stored charge on said gate structure during an initialization phase, said stored charge being generated such that, when said movable electrode contacts said fixed electrode during a subsequent sensing operation phase while said movable electrode is coupled to a fixed voltage potential, said stored charge is discharged from said gate structure to said fixed voltage potential.

7. The IC of claim 1, wherein the IC further comprises a readout control circuit configured to determine, after the sensing operation phase, whether the charge remains stored on the gate structure.

8. The IC of claim 1, wherein said actuating force comprises a pressing force, and wherein said hybrid MEMS-FG device further comprises a flexible membrane operably disposed over the MEMS switch such that said movable electrode contacts said fixed electrode in response to deformation of the flexible membrane by said pressing force.

9. The IC of claim 1, wherein said actuating force comprises an electrostatic force, and wherein the moveable electrode is disposed on an actuation arm, and said MEMS switch further comprises an electrostatic actuation electrode configured to operably generate said electrostatic force on said actuation arm in response to an actuation signal such that said actuation arm moves said movable electrode toward said fixed electrode.

10. The IC of claim 8, wherein said IC further comprises a sensing element operably configured to generate said actuation voltage in response to an externally applied stimulus.

11. The IC of claim 10, wherein said sensing element comprises one of a thermal sensor, a capacitive sensor, an ultrasonic sensor and an optical sensor.

12. The IC of claim 10, wherein said sensing element comprises a thermal sensing element and a micro heating element.

13. The IC of claim 1, wherein said at least one MEMS-FG device further comprises:
    a second NVM cell including a second drain region and a second source region formed in the semiconductor substrate, and a second gate structure disposed over a second channel region separating the second source region and the drain region; and
    an encryption circuit configured to generate an encoded data value based on a combination of a first charge stored on the first gate structure and a second charge stored on the second floating gate structure.

14. The IC of claim 13, wherein the IC further comprises a read/write control circuit configured to:
    write said second charge to the second floating gate structure during a first time period; and
    read out said encoded data value during a second time period subsequent to the first time period.

15. The IC of claim 14, wherein the encryption circuit comprises an exclusive-or (XOR) gate having input terminals respectively coupled to receive first and second data bits representing the first and second charges, respectively, stored on the first and second floating gate structures, and wherein said encoded data value is generated on an output terminal of the XOR gate.

* * * * *